(12) United States Patent
Okabe

(10) Patent No.: US 8,779,441 B2
(45) Date of Patent: Jul. 15, 2014

(54) SEMICONDUCTOR LIGHT EMITTING ELEMENT WITH FIRST AND SECOND ELECTRODE OPENINGS ARRANGED AT A CONSTANT DISTANCE

(75) Inventor: Takehiko Okabe, Ichihara (JP)

(73) Assignee: Toyoda Gosei Co., Ltd., Aichi (JP)

( * ) Notice: Subject to any disclaimer, the term of this patent is extended or adjusted under 35 U.S.C. 154(b) by 84 days.

(21) Appl. No.: 13/513,492

(22) PCT Filed: Dec. 2, 2010

(86) PCT No.: PCT/JP2010/071590
§ 371 (c)(1),
(2), (4) Date: Jun. 1, 2012

(87) PCT Pub. No.: WO2011/068162
PCT Pub. Date: Jun. 9, 2011

(65) Prior Publication Data
US 2012/0241760 A1 Sep. 27, 2012

(30) Foreign Application Priority Data
Dec. 4, 2009 (JP) ................................. 2009-276550

(51) Int. Cl.
*H01L 29/26* (2006.01)
*H01L 23/04* (2006.01)

(52) U.S. Cl.
USPC ............... 257/79; 257/81; 257/730; 257/773

(58) Field of Classification Search
USPC ...................... 257/79, 81, 730, 773
See application file for complete search history.

(56) References Cited

U.S. PATENT DOCUMENTS 5,563,422 A * 10/1996 Nakamura et al. ............. 257/13
6,091,083 A * 7/2000 Hata et al. ...................... 257/79
6,107,644 A * 8/2000 Shakuda et al. ................ 257/79
6,232,623 B1 * 5/2001 Morita ........................... 257/103
6,603,152 B2 * 8/2003 Song et al. ...................... 257/99
7,745,245 B2 * 6/2010 Niki et al. ....................... 438/40

(Continued)

FOREIGN PATENT DOCUMENTS

| JP | 7-94782 A | 4/1995 |
| JP | 10-209499 A | 8/1998 |
| JP | 2000-216439 A | 8/2000 |
| JP | 2001-345480 A | 12/2001 |

(Continued)

*Primary Examiner* — Thanh V Pham
(74) *Attorney, Agent, or Firm* — Sughrue Mion, PLLC

(57) ABSTRACT

Disclosed is a semiconductor light emitting element (1) which is provided with: a laminated semiconductor layer which is formed on a substrate, and in which a first semiconductor layer having a first conductivity type, a light emitting layer, and a second semiconductor layer having a second conductivity type different from the first conductivity type; a first electrode (first electrode (170)) which is formed on a surface of the first semiconductor layer in the laminated semiconductor layer, and has a first opening (170a) used for electrical connection with an outside; and a second electrode (second electrode (180)) which is formed on a surface of the second semiconductor layer, and has a second opening (180a) used for electrical connection with the outside. The surface of the second semiconductor layer is exposed by cutting off a part of the laminated semiconductor layer. The first opening (170a) has, on the second opening (180a) side of the first opening (170a) in a planar view, an arc portion which is formed to keep approximately equal distance from an outer edge portion of the second opening (180). With such a semiconductor light emitting element, workability and heat dissipation effects in the FC (flip-chip bonding) mounting technology of the semiconductor light emitting element are improved.

11 Claims, 13 Drawing Sheets

(56) References Cited

U.S. PATENT DOCUMENTS

| | | | |
|---|---|---|---|
| 7,791,098 B2 * | 9/2010 | Sakamoto et al. | 257/99 |
| 2005/0072984 A1 | 4/2005 | Kwak et al. | |
| 2008/0035935 A1 | 2/2008 | Shum | |
| 2008/0315241 A1 | 12/2008 | Shum | |
| 2009/0283795 A1 | 11/2009 | Miki et al. | |
| 2010/0052003 A1 | 3/2010 | Shum | |

FOREIGN PATENT DOCUMENTS

| | | |
|---|---|---|
| JP | 2003-110148 A | 4/2003 |
| JP | 2003-133590 A | 5/2003 |
| JP | 2005-117043 A | 4/2005 |
| JP | 2006-245232 A | 9/2006 |
| JP | 2008-041866 A | 2/2008 |
| JP | 2009-54688 A | 3/2009 |
| TW | 200812124 A | 3/2008 |

* cited by examiner

SEMICONDUCTOR LIGHT EMITTING ELEMENT WITH FIRST AND SECOND ELECTRODE OPENINGS ARRANGED AT A CONSTANT DISTANCE

CROSS REFERENCE TO RELATED APPLICATIONS

This application is a National Stage of International Application No. PCT/JP2010/071590, filed on Feb. 12, 2010, which claims priority from Japanese Patent Application No. 2009-276550, filed on Dec. 4, 2009, the contents of all of which are incorporated herein by reference in their entirety.

TECHNICAL FIELD

The present invention relates to a semiconductor light emitting element and a semiconductor light emitting device.

BACKGROUND ART

Recently, a GaN-based compound semiconductor has become a focus of attention as a semiconductor material of a short-wavelength light emitting element. The GaN-based compound semiconductor is formed by a metal organic chemical vapor deposition method (MOCVD method), a molecular beam epitaxy method (MBE method) or the like on a sapphire single crystal or other various oxides or group III-V compounds provided as a substrate.

In a semiconductor light emitting element using the GaN-based compound semiconductor, a laminated semiconductor layer having a light emitting diode (LED) structure constituted by an n-type semiconductor layer, a light emitting layer and a p-type semiconductor layer is formed on a substrate and an electrode having optical transparency (transparent electrode) is formed on the p-type semiconductor layer on the top portion, thereby extracting emitted light via the transparent electrode. In such a semiconductor light emitting element, it is necessary to set a current distribution to be uniform so that an unevenness of light emission intensity does not occur.

For example, in the Patent Literature 1, a semiconductor light emitting element that includes a semiconductor layer in a rectangular parallelepiped shape having a first conductivity type gallium nitride-based compound semiconductor layer, a light emission layer made of a gallium nitride-based compound semiconductor, and a second conductivity type gallium nitride-based compound semiconductor layer, those layers being formed in order on a top surface of a substrate; a first conductivity type electrode formed on a surface of the first conductivity type gallium nitride-based compound semiconductor layer; and a second conductivity type electrode formed on a surface of the second conductivity type gallium nitride-based compound semiconductor layer is disclosed. In the semiconductor light emitting element, the first conductivity type electrode and second conductivity type electrode are formed such that one electrode is in a polygonal annular shape to enclose the other electrode and internal edges of corners of the polygonal annular shape are formed in curved shapes in a planar view, thereby deviations in current density and current distribution are reduced.

CITATION LIST

Patent Literature

Patent Literature 1: Japanese Patent Application Laid-Open Publication No. 2009-054688

SUMMARY OF THE INVENTION

Technical Problem

In a semiconductor light emitting element, generally, on some portions of the transparent electrode, which connect to bonding wires made of Au (gold), bonding pads made of Au or an alloy containing Au are formed. In these years, an FC (flip-chip bonding) mount technology, in which a semiconductor light emitting element formed on a substrate that is transparent to light emission wavelength is reversed and mounted on a circuit board (submount) or a package has been developed. By the FC mount technology, light is extracted from a substrate side where no electrodes are formed to avoid light exclusion by electrodes, and thereby light extraction efficiency is improved. Moreover, since, in the semiconductor light emitting element and the circuit board (submount), the electrodes of the semiconductor light emitting element and pads of wiring on the circuit board (submount) are connected with each other via bumps made of Au or the like, an area on the circuit board (submount) required for mounting of the semiconductor light emitting element is reduced and mounting can be performed in high density, with high reliability in connection compared to the method of connection with bonding wires.

However, if an area of bonding pads is excessively small, a workability at the time of mounting the semiconductor light emitting element on the circuit board (submount) or the package becomes lower and a heat that is accompanied with light emission of a light emitting layer may not be sufficiently released.

It is an object of the present invention to improve workability and heat release effect in the FC (flip-chip bonding) mount technology of the semiconductor light emitting element.

Solution to Problem

According to the present invention, a semiconductor light emitting element and a semiconductor light emitting device according to (1) to (10) described below are provided.

(1) A semiconductor light emitting element includes: a laminated semiconductor layer that is formed on a substrate and in which a first semiconductor layer having a first conductivity type, a light emitting layer, and a second semiconductor layer having a second conductivity type different from the first conductivity type are laminated; a first electrode that is formed on a surface of the first semiconductor layer in the laminated semiconductor layer, and that has a first opening used for electrical connection with an outside; and a second electrode that is formed on a surface of the second semiconductor layer, and that has a second opening used for electrical connection with the outside, the surface of the second semiconductor layer being exposed by cutting off a part of the laminated semiconductor layer. The first opening has, on a second opening side, an arc portion that is formed to keep an approximately equal distance from an outer edge portion of the second opening in a planar view.

(2) In the semiconductor light emitting element according to (1), a planar shape of the substrate is a rectangle or a square; and the arc portion of the first opening is formed to keep a distance having a length corresponding to at least 10% of a short side of the substrate, from the outer edge portion of the second opening.

(3) In the semiconductor light emitting element according to any one of (1) and (2), an area of the first opening is at least 30% of a surface area of the first electrode.

(4) In the semiconductor light emitting element according to any one of (1) to (3), the second electrode has at least one branch portion branched to get along an outer peripheral edge of the substrate in a planer view.

(5) In the semiconductor light emitting element according to any one of (1) to (4), the second electrode has at least one branch portion formed on the surface of the second semiconductor layer, the surface of the second semiconductor layer being exposed by cutting off a part of the laminated semiconductor layer in a diagonal direction of the substrate in a planar view.

(6) In the semiconductor light emitting element according to any one of (1) to (5), the laminated semiconductor layer is composed of a group III nitride semiconductor.

(7) The semiconductor light emitting element according to any one of (1) to (6) further includes: a first connector that is formed at the first opening of the first electrode, has a conductive property, and is used for electrical connection between the first electrode and the outside; and a second connector that is formed at the second opening of the second electrode, has a conductive property, and is used for electrical connection between the second electrode and the outside.

(8) In the semiconductor light emitting element according to any one of (1) to (7), the substrate has optical transparency.

(9) In the semiconductor light emitting element according to any one of (1) to (8), the substrate is composed of sapphire.

(10) A semiconductor light emitting device includes: a semiconductor light emitting element including: a laminated semiconductor layer in which a first semiconductor layer having a first conductivity type, a light emitting layer, and a second semiconductor layer having a second conductivity type different from the first conductivity type are laminated in order; a first electrode that is formed on a surface of the first semiconductor layer in the laminated semiconductor layer, and that has a first opening used for electrical connection with an outside; and a second electrode that is formed on a surface of the second semiconductor layer, and that has a second opening used for electrical connection with the outside, the surface of the second semiconductor layer being exposed by cutting off a part of the laminated semiconductor layer; and a circuit board that is arranged so as to face a side where the first electrode and the second electrode of the semiconductor light emitting element are provided, and has a pair of wiring connected by a connector to each of the first electrode and the second electrode. In the semiconductor light emitting element, the first opening has, on a second opening side, an arc portion that is formed to keep an approximately equal distance from an outer edge portion of the second opening in a planar view.

Advantageous Effects of Invention

According to the present invention, it is possible to improve workability and heat release effect in the FC (flip-chip bonding) mount technology of the semiconductor light emitting element.

BRIEF DESCRIPTION OF THE DRAWINGS

Exemplary embodiments of the present invention will be described in detail based on the following figures, wherein.

DESCRIPTION OF EMBODIMENTS

Hereinbelow, exemplary embodiments according to the present invention will be described in detail. It should be noted that the present invention is not limited to the following exemplary embodiments, but can be practiced as various modifications within the scope of the gist of the invention. Further, each of the figures to be used indicates an example for illustration of each of the exemplary embodiments, and does not represent an actual size thereof.

<Semiconductor Light Emitting Element>

Figure 1:
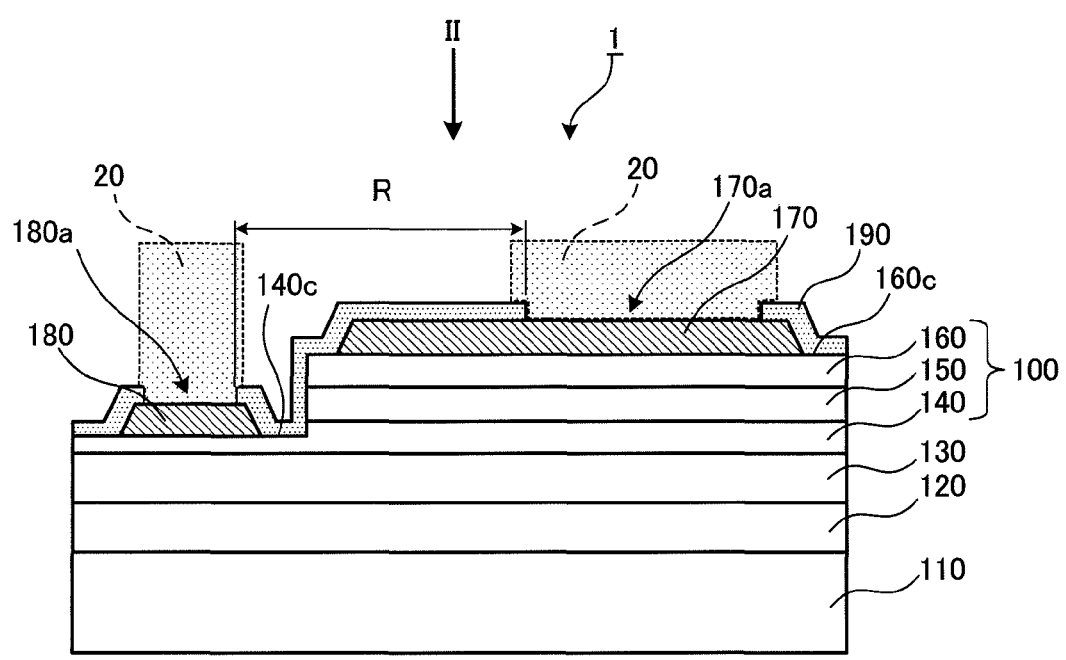
FIG. 1 is a diagram showing an example of a cross-sectional schematic view of a semiconductor light emitting element to which the first exemplary embodiment is applied.
Figure 2:
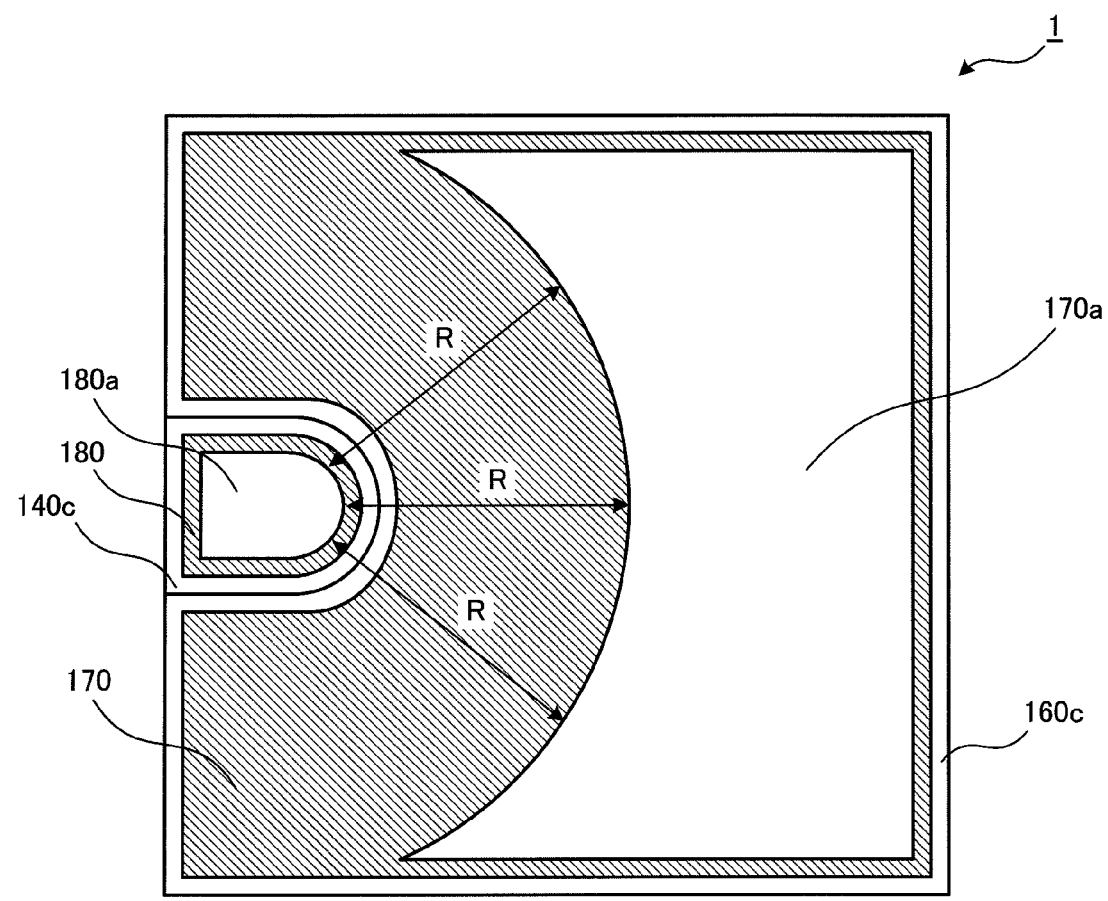
FIG. 2 is a diagram showing an example of a planar schematic view of the semiconductor light emitting element shown in FIG. 1, seen from II direction in FIG. 1.
Figure 3:
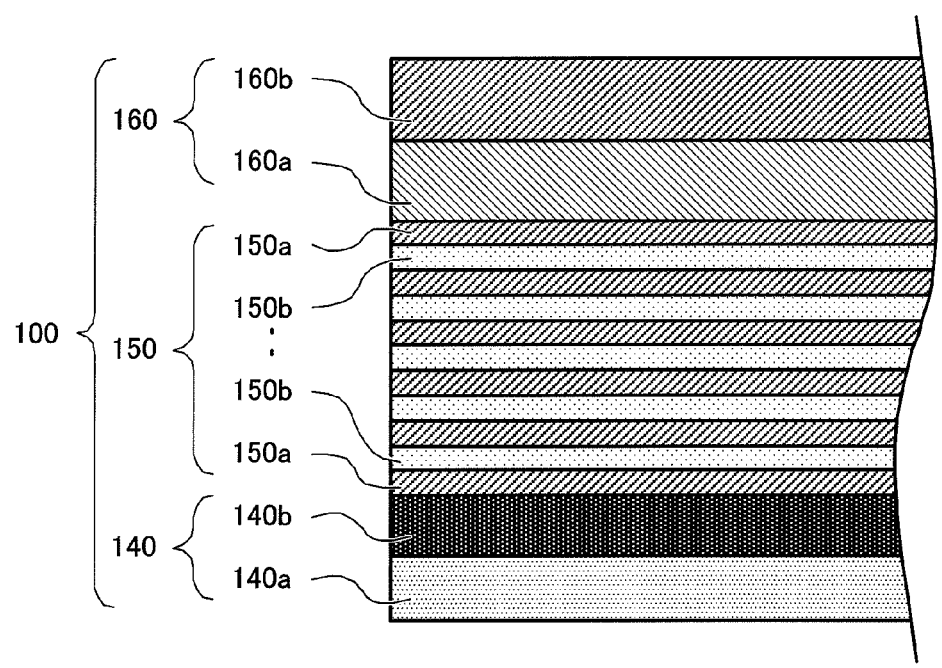
FIG. 3 is a diagram showing an example of a cross-sectional schematic view of a laminated semiconductor layer that constitutes the semiconductor light emitting element.

FIG. 1 is a diagram showing an example of a cross-sectional schematic view of a semiconductor light emitting element to which the first exemplary embodiment is applied. FIG. 2 is a diagram showing an example of a planar schematic view of the semiconductor light emitting element shown in FIG. 1, seen from II direction in FIG. 1. FIG. 3 is a diagram showing an example of a cross-sectional schematic view of a laminated semiconductor layer that constitutes the semiconductor light emitting element.

As shown in FIG. 1, a semiconductor light emitting element 1 includes: a substrate 110; an intermediate layer 120 laminated on the substrate 110; and a base layer 130 laminated on the intermediate layer 120. The semiconductor light emitting element 1 also includes: an n-type semiconductor layer 140 laminated on the base layer 130; a light emitting layer 150 laminated on the n-type semiconductor layer 140; and a p-type semiconductor layer 160 laminated on the light emitting layer 150. It should be noted that, in the following description, the n-type semiconductor layer 140, the light emitting layer 150 and the p-type semiconductor layer 160 are collectively referred to as a laminated semiconductor layer 100, if necessary.

Additionally, the semiconductor light emitting element 1 includes: a first electrode 170 formed on a top surface 160c of the p-type semiconductor layer 160; and a second electrode 180 formed on a semiconductor layer exposure surface 140c of the n-type semiconductor layer 140, which is exposed by cutting off a part of the laminated p-type semiconductor layer 160, light emitting layer 150 and n-type semiconductor layer 140.

Furthermore, the semiconductor light emitting element 1 includes a protecting layer 190 laminated on the first electrode 170, the second electrode 180, the p-type semiconductor layer 160, the light emitting layer 150 and a part (located on a light emitting layer 150 side compared to the semiconductor layer exposure surface 140c) of the n-type semiconductor layer 140. It should be noted that the protecting layer 190 is formed to cover, at a side where the semiconductor layer exposure surface 140c is provided, whole area of side wall surfaces of the p-type semiconductor layer 160, the light emitting layer 150 and a part (located on the light emitting layer 150 side compared to the semiconductor layer exposure surface 140c) of the n-type semiconductor layer 140.

On the other hand, a first opening 170a used for electrical connection with an outside via a bump (first connector) 20, as will be described later, is formed by exposing a part of a surface of the first electrode 170 which faces upward in FIG. 1. Similarly, a second opening 180a used for electrical connection with the outside via the bump (second connector) 20, as will be described later, is formed by exposing a part of a surface of the second electrode 180 which faces upward in FIG. 1. As shown in FIG. 1, the first opening 170a is formed to keep a constant distance R from an outer edge portion of the second opening 180a. Details of the first opening 170a and the second opening 180a will be described later.

As described above, the semiconductor light emitting element 1 of the exemplary embodiment has a configuration in which the first electrode 170 and the second electrode 180 are formed on one surface side opposite to the substrate 110. In this semiconductor light emitting element 1, the first electrode 170 and the second electrode 180 are set to be positive and negative respectively, a current is applied to the laminated semiconductor layer 100 (more specifically, the p-type semiconductor layer 160, the light emitting layer 150 and the n-type semiconductor layer 140) via these electrodes, and thereby the light emitting layer 150 emits light.

As shown in FIG. 2, in a planar view, the first electrode 170 is formed so as to cover substantially all of the top surface 160c of the p-type semiconductor layer 160, except for a part removed to form the second electrode 180 by an etching method or the like. On an upper surface of the first electrode 170, the first opening 170a that exposes the first electrode 170 and is used for electrical connection with the outside is formed. The first opening 170a exposes an approximately right-half portion of the first electrode 170 in FIG. 2. The first opening 170a has a planar shape in which a portion at the second electrode 180 side is cut off so as to be formed into an arc.

On the other hand, the second electrode 180 is formed at an approximately central portion of a part which is adjacent to one side of the substrate 110 having a square shape in a planar view. As mentioned above, the second electrode 180 is formed on the semiconductor layer exposure surface 140c which has been exposed, and on an upper surface of the second electrode 180, the second opening 180a that is used for electrical connection with the outside is formed. It should be noted that the protecting layer 190 that covers the first electrode 170 and the second electrode 180 is omitted in FIG. 2, however, for an explanatory convenience sake, outlines of the openings 170a, 180a and the like in a state of being covered with the protecting layer 190 are illustrated.

As shown in FIG. 2, the first opening 170a for exposing the first electrode 170 and the second opening 180a for exposing the second electrode 180 are arranged so that an outer edge portion of the first opening 170a at the second opening 180a side and an outer edge portion of the second opening 180a at a first opening 170a side keep the constant distance R from each other. In the exemplary embodiment, in a planar view, the first opening 170a at the second opening 180a side is formed into an arc so that the approximately equal distance R is kept from the outer edge portion of the second opening 180a, according to the shape of the second opening 180a at the first opening 170a side, which is formed into a semicircular shape.

The distance R from the outer edge portion of the second opening 180a to the outer edge portion of the first opening 170a is not particularly limited, however, in the exemplary embodiment, it is formed to keep a length which corresponds to at least 10% of the one side of the substrate 110 having a square shape in a planar view. In the exemplary embodiment in which the substrate 110 has a rectangular shape in a planar view, the distance R is formed to keep a length which corresponds to at least 10% of one short side of the substrate 110. By forming the first opening 170a while keeping the distance R from the outer edge portion of the second opening 180a, workability is improved in the FC (flip-chip bonding) mount technology of the semiconductor light emitting element. In the exemplary embodiment, if the distance R is excessively small, a p-electrode and an n-electrode are easy to get short-circuited at mounting the flip-chip. If the distance R is excessively large, a contact area with a circuit board decreases, heat release becomes insufficient, and the characteristic feature thereof tends to be deteriorated.

Further, in the exemplary embodiment, a rate of a surface area of the first opening 170a in a planar view to a surface area of the first electrode 170 is set to be at least 20% of the surface area of the first electrode 170, preferably at least 30% thereof.

Next, each layer of the semiconductor light emitting element 1 will be explained.

<Substrate>

As the substrate 110, there is no particular limitation on any substrate as long as group III nitride semiconductor crystals are epitaxially grown on a surface thereof, and accordingly, various kinds of substrate can be selected and used. However, as will be described later, since the semiconductor light-emitting element 1 of the exemplary embodiment is flip-chip mounted so that the light is extracted from the substrate 110 side, it is preferable to have optical transparency to the light emitted from the light-emitting layer 150. Accordingly, the substrate 110 composed of, for example, sapphire, zinc oxide, magnesium oxide, zirconium oxide, magnesium-aluminum oxide, gallium oxide, indium oxide, lithium-gallium oxide, lithium-aluminum oxide, neodium-gallium oxide, lanthanum-strontium-aluminum-tantalum oxide, strontium-titanium oxide, titanium oxide or the like can be used.

Among the above-described materials, it is preferable to use sapphire in which C-face is a principal surface as the substrate 110. In the case where the sapphire is used as the substrate 110, the intermediate layer 120 (buffer layer) may be formed on the C-face of the sapphire.

<Laminated Semiconductor Layer>

The laminated semiconductor layer 100 as an example of the group III nitride semiconductor layer is composed of, for example, a group III nitride semiconductor, and is configured by laminating the n-type semiconductor layer 140, the light-emitting layer 150 and the p-type semiconductor layer 160 on the substrate 110 in this order, as shown in FIG. 1. Further, as shown in FIG. 3, each of the n-type semiconductor layer 140, the light-emitting layer 150 and the p-type semiconductor layer 160 may be configured by plural semiconductor layers. The laminated semiconductor layer 100 may further includes the base layer 130 and the intermediate layer 120. Here, the n-type semiconductor layer 140 performs electrical conduction as a first conductivity type in which an electron is a carrier, while the p-type semiconductor layer 160 performs electrical conduction as a second conductivity type in which a hole is a carrier.

It should be noted that the laminated semiconductor layer 100 with excellent crystallinity can be obtained by forming by an MOCVD method, however, a sputtering method under optimized conditions can form a semiconductor layer having more excellent crystallinity than that formed by the MOCVD method. Hereinafter, descriptions will be sequentially given.

<Intermediate Layer>

The intermediate layer 120 is preferably composed of polycrystal $Al_xGa_{1-x}N$ ($0 \leq x \leq 1$), and more preferably, composed of single crystal $Al_xGa_{1-x}N$ ($0 \leq x \leq 1$).

The intermediate layer 120 can be, for example, composed of polycrystal $Al_xGa_{1-x}N$ ($0 \leq x \leq 1$) with a thickness of 0.01 μm to 0.5 μm, as mentioned above. If the thickness of the intermediate layer 120 is less than 0.01 μm, there are some cases where an effect of the intermediate layer 120 to mediate the difference in lattice constant between the substrate 110 and the base layer 130 cannot be sufficiently obtained. On the other hand, if the thickness of the intermediate layer 120 is more than 0.5 μm, there is a possibility that the time of forming process of the intermediate layer 120 becomes longer though there is no change to the function of the intermediate layer 120, and accordingly the productivity may be decreased.

The intermediate layer 120 has a function of mediating the difference in lattice constant between the substrate 110 and the base layer 130 to facilitate the formation of a single crystal layer which is C-axis oriented on the (0001) surface (C-face) of the substrate 110. Consequently, on the intermediate layer 120, the base layer 130 having more excellent crystallinity can be laminated. It should be noted that it is preferable to form the intermediate layer 120 in the present invention, but the intermediate layer 120 is not necessarily formed.

Further, the intermediate layer 120 may have a crystal structure of a hexagonal system composed of the group III nitride semiconductor. Moreover, as the crystal of the group III nitride semiconductor constituting the intermediate layer 120, the crystal having a single crystal structure is preferably used. Crystals of the group III nitride semiconductor grow not only in an upper direction but also in an in-plane direction to form a single crystal structure by controlling growing conditions. Accordingly, the intermediate layer 120 can be composed of the group III nitride semiconductor crystals having single crystal structure by controlling layer forming conditions of the intermediate layer 120. In the case where the intermediate layer 120 having such a single crystal structure is formed on the substrate 110, the buffer function of the intermediate layer 120 effectively works, and thereby the group III nitride semiconductor formed thereon becomes a crystal film having excellent orientation property and crystallinity.

<Base Layer>

As the base layer 130, $Al_xGa_yIn_zN$ ($0 \leq x \leq 1$, $0 \leq y \leq 1$, $0 \leq z \leq 1$, $x+y+z=1$) can be used, but it is preferable to use $Al_xGa_{1-x}N$ ($0 \leq x < 1$) because the base layer 130 with excellent crystallinity can be formed.

The thickness of the base layer 130 is preferably 0.1 μm or more, more preferably 0.5 μm or more, and most preferably 1 μm or more. The $Al_xGa_{1-x}N$ layer having excellent crystallinity is likely to be obtained with these layer thickness or more. Further, in terms of production cost, the thickness of the base layer 130 is preferably 10 μm or less.

To improve the crystallinity of the base layer 130, it is desirable that the base layer 130 is not doped with impurities. However, if conductivity of p-type or n-type is needed, acceptor impurities or donor impurities can be added.

<N-Type Semiconductor Layer>

As shown in FIG. 3, for example, the n-type semiconductor layer 140, as an example of a first semiconductor layer having a first conductivity type in which an electron is a carrier, is preferably configured with an n-contact layer 140a and an n-cladding layer 140b. It should be noted that the n-contact layer 140a can also serve as the n-cladding layer 140b. Further, the above-mentioned base layer 130 may be included in the n-type semiconductor layer 140.

The n-contact layer 140a is a layer for providing the second electrode 180. The n-contact layer 140a is preferably configured with the $Al_xGa_{1-x}N$ layer ($0 \leq x < 1$, preferably $0 \leq x \leq 0.5$, and more preferably $0 \leq x \leq 0.1$).

Further, the n-contact layer 140a is preferably doped with n-type impurities, and preferably contains the n-type impurities having a concentration of $1 \times 10^{17}/cm^3$ to $1 \times 10^{20}/cm^3$, and preferably a concentration of $1 \times 10^{18}/cm^3$ to $1 \times 10^{19}/cm^3$ on the point that a good ohmic contact with the second electrode 180 can be maintained. The n-type impurities are not particularly limited, however, Si, Ge, Sn and the like are provided, and Si and Ge are preferably provided.

The thickness of the n-contact layer 140a is preferably set at 0.5 μm to 5 μm, and more preferably set in a range of 1 μm to 3 μm. If the thickness of the n-contact layer 140a is in the above-described ranges, crystallinity of the semiconductor is suitably maintained.

It is preferable to provide the n-cladding layer 140b between the n-contact layer 140a and the light emitting layer 150. The n-cladding layer 140b is a layer for performing injection of the carriers into the light emitting layer 150 and confinement of the carriers. The n-cladding layer 140b can be formed of AlGaN, GaN, GaInN and the like. Further, the hetero junction structure or the superlattice structure in which the layer is laminated plural times of these structures may also be used. In the case where the n-cladding layer 140b is formed of GaInN, the band gap thereof is desirably larger than that of GaInN of the light-emitting layer 150.

The thickness of the n-cladding layer 140b is not particularly limited, but preferably in a range of 0.005 μm to 0.5 μm, and more preferably in a range of 0.005 μm to 0.1 μm. The n-type doping concentration of the n-cladding layer 140b is preferably in a range of $1 \times 10^{17}/cm^3$ to $1 \times 10^{20}/cm^3$, and more preferably in a range of $1 \times 10^{18}/cm^3$ to $1 \times 10^{19}/cm^3$. It is preferable to provide the doping concentration in these ranges in terms of maintaining excellent crystallinity and reducing operation voltage of the light emitting element.

It should be noted that, in the case where the n-cladding layer 140b is a layer containing the superlattice structure, the layer may contain a structure in which an n-side first layer composed of the group III nitride semiconductor with a thickness of 100 angstrom or less and an n-side second layer having a different composition from the n-side first layer and composed of the group III nitride semiconductor with a thickness of 100 angstrom or less are laminated, though detailed illustration is omitted.

Further, the n-cladding layer 140b may contain a structure in which the n-side first layers and the n-side second layers are alternately and repeatedly laminated, and the structure is preferably an alternating structure of GaInN and GaN or an alternating structure of GaInN having different compositions.

<Light Emitting Layer>

As the light emitting layer 150 laminated on the n-type semiconductor layer 140, a single quantum well structure or a multiple quantum well structure can be employed.

As a well layer 150b having a quantum well structure as shown in FIG. 3, the group III nitride semiconductor layer composed of $Ga_{1-y}In_yN$ ($0<y<0.4$) is usually used. The thickness of the well layer 150b may be the thickness by which quantum effects can be obtained, for example, 1 nm to 10 nm, and preferably 2 nm to 6 nm in terms of light emission output.

Moreover, in the case of the light emitting layer 150 having the multiple quantum well structure, the above-described $Ga_{1-y}In_yN$ is employed as the well layer 150b, and $Al_zGa_{1-z}N$ ($0 \leq z<0.3$) having a band gap energy larger than that of the well layer 150b is employed as a barrier layer 150a. The well layer 150b and the barrier layer 150a may be doped or not doped with impurities depending upon a design thereof.

It should be noted that, in the exemplary embodiment, the light emitting layer 150 is configured to output blue light (light emission wavelength λ=about 400 nm to 465 nm).

<P-Type Semiconductor Layer>

As shown in FIG. 3, for example, the p-type semiconductor layer 160, as an example of a second semiconductor layer having a second conductivity type in which a hole is a carrier, is usually configured with a p-cladding layer 160a and a p-contact layer 160b. Further, the p-contact layer 160b can also serve as the p-cladding layer 160a.

The p-cladding layer 160a is a layer performing confinement of carriers within the light emitting layer 150 and injection of carriers. The p-cladding layer 160a is not particularly limited as long as the band gap energy of the composition thereof is larger than that of the light emitting layer 150 and carriers can be confined within the light emitting layer 150, but is preferably composed of $Al_xGa_{1-x}N$ ($0<x \leq 0.4$).

It is preferable that the p-cladding layer 160a is composed of such AlGaN in terms of confinement of carriers within the light emitting layer 150. The thickness of the p-cladding layer 160a is not particularly limited, but preferably 1 nm to 400 nm, and more preferably 5 nm to 100 nm.

The p-type doping concentration of the p-cladding layer 160a is preferably $1 \times 10^{18}/cm^3$ to $1 \times 10^{21}/cm^3$, and more preferably $1 \times 10^{19}/cm^3$ to $1 \times 10^{20}/cm^3$. If the p-type doping concentration is in the above ranges, excellent p-type crystals can be obtained without deteriorating crystallinity.

Further, the p-cladding layer 160a may have a superlattice structure in which the layer is laminated plural times of these structures, and preferably has an alternating structure of AlGaN and AlGaN or an alternating structure of AlGaN and GaN.

The p-contact layer 160b is a layer for providing the first electrode 170. The p-contact layer 160b is preferably composed of $Al_xGa_{1-x}N$ ($0 \leq x \leq 0.4$). It is preferable that Al composition is in the above-described range in terms of allowing to maintain excellent crystallinity and good ohmic contact with the first electrode 170.

It is preferable to contain p-type impurities (dopants) in a concentration of $1 \times 10^{18}/cm^3$ to $1 \times 10^{21}/cm^3$, and preferably $5 \times 10^{19}/cm^3$ to $5 \times 10^{20}/cm^3$ in terms of maintaining good ohmic contact, preventing cracking and maintaining excellent crystallinity. The p-type impurities are not particularly limited, but, for example, Mg is preferably provided.

The thickness of the p-contact layer 160b is not particularly limited, but is preferably 10 nm to 500 nm, and more preferably 50 nm to 200 nm. It is preferable to provide the thickness of the p-contact layer 160b in these ranges in terms of light emission output.

<First Electrode>

Figure 4:
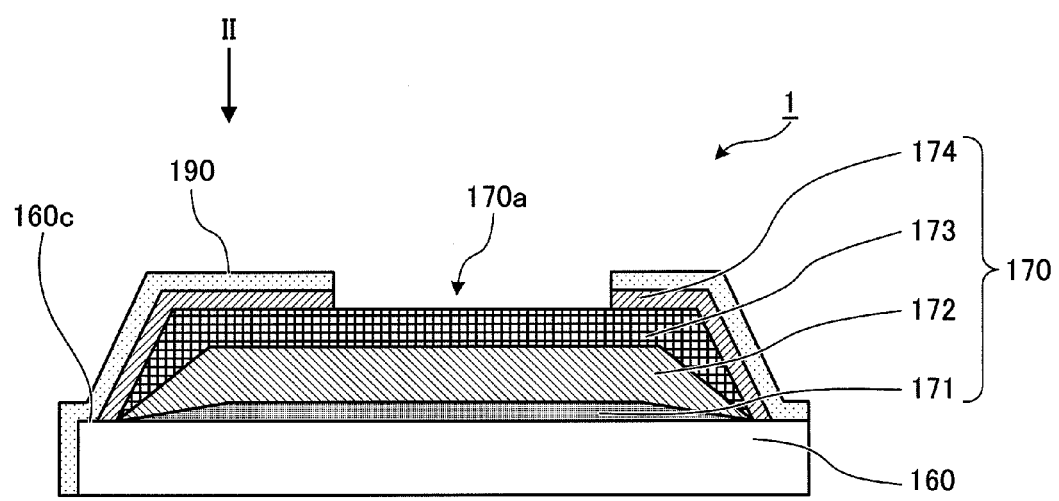
FIG. 4 is a diagram showing an example of a cross-sectional schematic view of a first electrode.

Next, the configuration of the first electrode 170 will be explained. FIG. 4 is a diagram showing an example of a cross-sectional schematic view of the first electrode 170.

The first electrode 170 as an example of a first electrode includes: a first conductive layer 171 laminated on the top surface 160c of the p-type semiconductor layer 160; a metal reflecting layer 172 laminated on the first conductive layer 171; a first bonding layer 173 laminated on the metal reflecting layer 172; and a first adhesive layer 174 that is provided to cover the aforementioned first bonding layer 173 except for the first opening 170a, which is an exposure portion of the aforementioned first bonding layer 173. On a surface of the first adhesive layer 174 opposite to the surface facing the first bonding layer 173, the protecting layer 190 is laminated.

<First Conductive Layer>

As shown in FIG. 4, the first conductive layer 171 is formed to cover a substantially whole surface of the p-type semiconductor layer 160 except for a peripheral edge portion of the top surface 160c of the p-type semiconductor layer 160, a part of which has been removed by an etching method or the like, for forming the second electrode 180. The central portion of the first conductive layer 171 has a constant thickness and is formed substantially flat with respect to the top surface 160c, whereas, the end portion of the first conductive layer 171 is formed to be inclined with respect to the top surface 160c of the p-type semiconductor layer 160 due to gradual reduction of the thickness thereof. However, the first conductive layer 171 is not limited to such a shape, but may be formed in lattice patterns or tree patterns with some spaces in between, further, may have a rectangular cross section.

As the first conductive layer 171, it is preferable to use one that is able to make an ohmic contact with the p-type semiconductor layer 160 and has small contact resistance with the p-type semiconductor layer 160. Since light from the light emitting layer 150 is extracted, via the metal reflecting layer 172, from the substrate 110 side in the semiconductor light emitting element 1, as the first conductive layer 171, it is preferable to use one that is good in optical transparency. Further, for uniformly passing a current over the entire surface of the p-type semiconductor layer 160, it is preferable to use the first conductive layer 171 having excellent conductivity and narrow resistance distribution. Still Further, in the exemplary embodiment, the thickness of the first conductive layer 171 is set to be 5 nm (50 Å). It should be noted that the thickness of the first conductive layer 171 can be selected from the range of 2 nm to 18 nm. If the thickness of the first conductive layer 171 is less than 2 nm, there are some cases in which it becomes hard to make an ohmic contact with the p-type semiconductor layer 160. If the thickness of the first conductive layer 171 is more than 18 nm, there are some cases in which it is not favorable in terms of optical transparency to the light emitted from the light emitting layer 150 and the reflected light from the metal reflecting layer 172.

An example of the first conductive layer 171 is a transparent conductive layer. For example, in the exemplary embodiment, conductive materials composed of oxides, which are good in optical transparency to the light of the wavelength emitted from the light emitting layer 150, may be used as the first conductive layer 171. Particularly, part of oxides containing In is preferable in the point that both optical transparency and conductivity are superior to other transparent conductive films. Specific examples of conductive oxides containing In include: ITO (indium tin oxide ($In_2O_3$—

SnO$_2$)); IZO (indium zinc oxide (In$_2$O$_3$—ZnO)); IGO (indium gallium oxide (In$_2$O$_3$—Ga$_2$O$_3$)); and ICO (indium cerium oxide (In$_2$O$_3$—CeO$_2$)). It should be noted that a dopant such as fluorine may be added to these materials. Further, for example, as oxides not containing In, conductive materials such as carrier-doped SnO$_2$, ZnO$_2$ and TiO$_2$ may be employed.

The first conductive layer 171 can be formed by providing these materials by any well-known conventional method in this technical field. Moreover, there are some cases where thermal annealing is performed for improving transparency and further reducing resistance of the first conductive layer 171 after forming the first conductive layer 171.

In the exemplary embodiment, as the first conductive layer 171, those having a crystallized structure may be used. In particular, a transparent material containing In$_2$O$_3$ crystals having a crystal structure of a hexagonal system or a bixbyite structure (for example, ITO or IZO) is preferably used.

For example, in the case where IZO containing In$_2$O$_3$ crystals having a crystal structure of a hexagonal system is used as the first conductive layer 171, an amorphous IZO film that has an excellent etching property can be used and processed into a specific shape, and thereafter, by transferring from the amorphous state into a structure containing crystals through a heat treatment or the like, processed into an electrode that is excellent in optical transparency than the amorphous IZO film.

Further, as the IZO film used for the first conductive layer 171, it is preferable to use a composition showing the lowest specific resistance.

For example, a ZnO concentration in IZO is preferably 1% by mass to 20% by mass, more preferably in a range of 5% by mass to 15% by mass, and 10% by mass is especially preferred.

The heat treatment of the IZO film used for the first conductive layer 171 is desirably performed in an atmosphere not containing O$_2$, and as the atmosphere not containing O$_2$, an inert gas atmosphere such as N$_2$ atmosphere or a mixed gas atmosphere of H$_2$ and an inert gas such as N$_2$ can be provided, and accordingly, the N$_2$ atmosphere or the mixed gas atmosphere of N$_2$ and H$_2$ is desirable. It should be noted that, if the heat treatment of the IZO film is performed in the N$_2$ atmosphere or in the mixed gas atmosphere of N$_2$ and H$_2$, it is possible, for example, to crystallize the IZO film into a film containing In$_2$O$_3$ crystals having a crystal structure of a hexagonal system and effectively reduce a sheet resistance of the IZO film.

The heat treatment temperature of the IZO film is preferably 500° C. to 1000° C. If the heat treatment is performed at a temperature lower than 500° C., it is feared that the IZO film cannot be crystallized sufficiently and optical transparency of the IZO film may not be sufficiently high. If the heat treatment is performed at a temperature higher than 1000° C., there are some cases where the IZO film is crystallized but optical transparency of the IZO film is not sufficiently high. Further, in the case where the heat treatment is performed at a temperature higher than 1000° C., there is also a possibility of deteriorating the semiconductor layer provided below the IZO film.

In the case of crystallizing the IZO film in an amorphous state, differences in film forming conditions or heat treatment conditions result in a difference in a crystal structure in the IZO film. However, in the exemplary embodiment according to the present invention, in terms of adhesion properties to other layers, the material of the first conductive layer 171 is not limited but a crystalline material is preferred, and in particular, in the case of crystalline IZO, IZO may contain In$_2$O$_3$ crystals having a bixbyite crystal structure or In$_2$O$_3$ crystals having a crystal structure of a hexagonal system. Particularly, IZO containing In$_2$O$_3$ crystals having a crystal structure of a hexagonal system is preferred.

Especially, as mentioned above, the IZO film crystallized by the heat treatment shows better adhesion properties to the p-type semiconductor layer 160 than those of the IZO film in an amorphous state, thus being effective in the exemplary embodiment according to the present invention. Moreover, since the resistance is reduced in the IZO film crystallized by the heat treatment compared to that in the IZO film in an amorphous state, the IZO film crystallized by the heat treatment is preferred in the point that the forward voltage (Vf) can be reduced when the semiconductor light emitting element 1 is configured.

<Metal Reflecting Layer>

As shown in FIG. 4, the metal reflecting layer 172 is formed to cover the whole area of the first conductive layer 171. The central portion of the metal reflecting layer 172 has a constant thickness and is formed substantially flat, whereas, the end portion side of the metal reflecting layer 172 is formed to be inclined with respect to the top surface 160c of the p-type semiconductor layer 160 due to gradual reduction of the thickness thereof. Moreover, the metal reflecting layer 172 is formed on the first conductive layer 171, and is not configured to be formed on the p-type semiconductor layer 160. In other words, the p-type semiconductor layer 160 and the metal reflecting layer 172 are configured not to contact each other directly.

The metal reflecting layer 172 is configured with Ag (silver). The reason why silver is employed as the metal reflecting layer 172 is that silver has high light reflectivity to the light of the wavelength in blue to green regions emitted from the light emitting layer 150. Also, as will be described later, the reason is that the resistance of the metal reflecting layer 172 is low because the metal reflecting layer 172 has a function for feeding to the p-type semiconductor layer 160 through the first conductive layer 171, and in addition, it is required to keep the contact resistance with the first conductive layer 171 low. In the exemplary embodiment, the thickness of the metal reflecting layer 172 is set to 100 nm (1000 Å). The thickness of the metal reflecting layer 172 is preferably selected from the range of 50 nm or more. Here, if the thickness of the metal reflecting layer 172 is less than 50 nm, there are some cases that are not preferable in terms of deterioration of reflective performance of light emitted from the light emitting layer 150.

It should be noted that the simple substance of Ag is used as the metal reflecting layer 172 in the exemplary embodiment, however, an alloy containing Ag may also be used.

<First Bonding Layer>

As shown in FIG. 4, on the top surface and side surface of the metal reflecting layer 172, the first bonding layer 173 is laminated to cover the metal reflecting layer 172. The first bonding layer 173 is formed to cover the whole area of the metal reflecting layer 172. While the central portion of the first bonding layer 173 has a constant thickness and is formed substantially flat, the end portion side of the first bonding layer 173 is formed to be inclined with respect to the top surface 160c of the p-type semiconductor layer 160 due to gradual reduction of the thickness thereof.

The first bonding layer 173 as a connecting layer used for electrical connection with the outside includes at least one metal layer on an innermost side so as to be in contact with the metal reflecting layer 172. Further, for a metal layer as a surface layer on an outermost side, for example, Au (gold) is used in general. In the exemplary embodiment, a single-layer film of Au (gold) is used as the first bonding layer 173. However, for example, a structure including an Ni (nickel) layer as a first layer formed so as to be in contact with the metal reflecting layer 172, a Pt (platinum) layer as a second layer formed outside the Ni layer, and an Au (gold) layer as a third layer formed outside the Pt layer and on an outermost side may be employed. The entire thickness of the first bonding layer 173 is not limited as long as the thickness is sufficient to have a function as a pad electrode when flip-chip mounting is performed, and the thickness is preferably set at 50 nm (500 Å) to 8000 nm (80000 Å).

It should be noted that, in the case where the first bonding layer 173 is configured with plural metal layers, as the materials constituting the first layer being in contact with the metal reflecting layer 172, for example, Ta (tantalum), Ti (titanium), an NiTi (nickel-titanium) alloy and a nitride thereof can be used other than aforementioned Ni (nickel).

<First Adhesive Layer>

As shown in FIG. 4, on the top surface and side surface of the first bonding layer 173, the first adhesive layer 174 is laminated to cover the first bonding layer 173. The first adhesive layer 174 is formed to cover the region of the first bonding layer 173 except for an exposed portion thereof. The central portion of the first adhesive layer 174 has a constant thickness and is formed substantially flat, whereas, the end portion side of the first adhesive layer 174 is formed to be inclined with respect to the top surface 160*c* of the p-type semiconductor layer 160. The end portion of the side surface side of the first adhesive layer 174 is provided to contact the top surface 160*c* of the p-type semiconductor layer 160.

The first adhesive layer 174 as an example of an adhesive layer is provided for improving physical adhesive properties between the first bonding layer 173 configured with Au (gold) and the protecting layer 190. In the exemplary embodiment, the first adhesive layer 174 is made of, for example, Ta (tantalum). However, other than Ta (tantalum), it is possible to use, for example, Ti (titanium) or Ni (nickel) as the first adhesive layer 174.

<Second Electrode>

Figure 5:
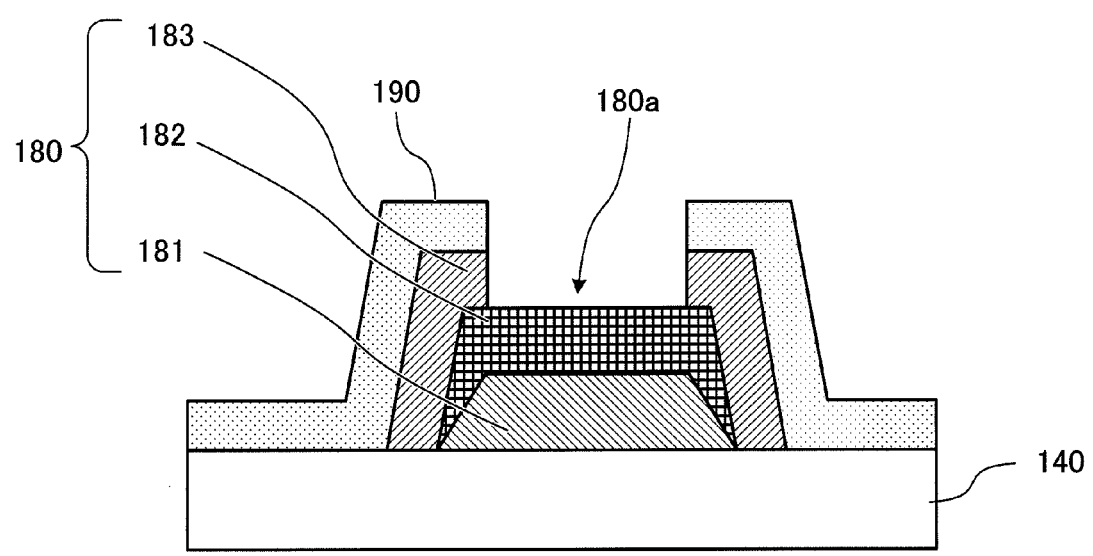
FIG. 5 is a diagram showing an example of a cross-sectional schematic view of a second electrode.

Next, the configuration of the second electrode 180 will be described. FIG. 5 is a diagram showing an example of a cross-sectional schematic view of a second electrode 180.

The second electrode 180 as an example of a second electrode includes: a second conductive layer 181 laminated on the semiconductor layer exposure surface 140*c* of the n-type semiconductor layer 140; a second bonding layer 182 laminated on the second conductive layer 181; and a second adhesive layer 183 that is provided to cover the aforementioned second bonding layer 182 except for the second opening 180*a*, which is an exposure portion of the second bonding layer 182. On a surface of the second adhesive layer 183 opposite to the surface facing the second bonding layer 182, the protecting layer 190 is laminated.

<Second Conductive Layer>

As shown in FIG. 5, the second conductive layer 181 is laminated on the n-type semiconductor layer 140. As mentioned above, in a planar view, one side part of the second conductive layer 181 (refer to FIG. 2) has a semi-circular outline. The central portion of the second conductive layer 181 has a constant thickness and is formed substantially flat with respect to the semiconductor layer exposure surface 140*c* (refer to FIG. 1), whereas, the end portion side of the second conductive layer 181 is formed to be inclined with respect to the semiconductor layer exposure surface 140*c* of the n-type semiconductor layer 140 (refer to FIG. 1) due to gradual reduction of the thickness thereof. However, the second conductive layer 181 is not limited to such a shape, but may be formed in lattice patterns or tree patterns with some spaces in between, further, may have a rectangular cross section, and still further, may have an outline other than the circular shape.

As the second conductive layer 181, it is preferable to use one that is able to make an ohmic contact with the n-type semiconductor layer 140 and has small contact resistance with the n-type semiconductor layer 140.

In the exemplary embodiment, as the second conductive layer 181, Al (aluminum) is used. Al (aluminum) constituting the second conductive layer 181 has high light reflectivity to the light of the wavelength in the region of blue to green emitted from the light emitting layer 150 similarly to Ag (silver) constituting the aforementioned metal reflecting layer 172 of the first electrode 170, and is able to function as a metal reflecting layer.

<Second Bonding Layer>

As shown in FIG. 5, the second bonding layer 182 is laminated on the second conductive layer 181. The second bonding layer 182 is formed to cover the whole area of the second conductive layer 181. The central portion of the second bonding layer 182 has a constant thickness and is formed substantially flat, whereas, the end portion side of the second bonding layer 182 is formed to be inclined with respect to the semiconductor layer exposure surface 140*c* (refer to FIG. 1) of the n-type semiconductor layer 140 due to gradual reduction of the thickness thereof.

Similarly to the aforementioned first bonding layer 173 of the first electrode 170, the second bonding layer 182 includes at least one metal layer on an innermost side so as to be in contact with the second conductive layer 181. As the metal layer as a surface layer on an outermost side, Au (gold) is used in general. In the exemplary embodiment, the second bonding layer 182 is configured with a single-layer film of Au (gold) similarly to the first bonding layer 173. The entire thickness of the second bonding layer 182 is preferably set at 50 nm (500 Å) to 8000 nm (80000 Å). It should be noted that the second bonding layer 182 may have a laminated structure of plural metal layers.

<Second Adhesive Layer>

As shown in FIG. 5, the second adhesive layer 183 is laminated on the second bonding layer 182. The second adhesive layer 183 is formed to cover the region of the second bonding layer 182 except for the exposed portion thereof. The central portion of the second adhesive layer 183 has a constant thickness and is formed substantially flat, whereas, the end portion side of the second adhesive layer 183 is formed to be inclined with respect to the semiconductor layer exposure surface 140*c* (refer to FIG. 1) of the n-type semiconductor layer 140. The end portion of the second adhesive layer 183 at the side surface side is provided to contact the semiconductor layer exposure surface 140*c* (refer to FIG. 1) of the n-type semiconductor layer 140.

Similarly to the aforementioned first adhesive layer 174 of the first electrode 170, the second adhesive layer 183 is provided to improve physical adhesive properties between the second bonding layer 182 configured with Au (gold) and the protecting layer 190. In the exemplary embodiment, similarly to the first adhesive layer 174, the second adhesive layer 183 is made of Ta (tantalum). However, other than Ta (tantalum), it is possible to use, for example, Ti (titanium) or Ni (nickel) as the second adhesive layer 183.

<Protecting Layer>

As shown in FIG. 5, the protecting layer 190 composed of an oxide of silicon such as $SiO_2$ is laminated to cover the first electrode 170 and the second electrode 180 except for a part of each thereof, and also, cover the p-type semiconductor layer 160, the light emitting layer 150 and a part (located on a light emitting layer 150 side compared to the semiconductor layer exposure surface 140c (refer to FIG. 1)) of the n-type semiconductor layer 140. The protecting layer 190 is provided with a function as a protecting layer for suppressing intrusion of water or the like from the outside into the light emitting layer 150, the first electrode 170 and the second electrode 180, and a function as an auxiliary reflecting layer for reflecting light included in the light emitted from the light emitting layer 150, which does not directly head for the substrate 110 and is not reflected by the metal reflecting layer 172 of the first electrode 170 or the second conductive layer 181 of the second electrode 180, toward the substrate 110.

Second Exemplary Embodiment

Figure 6:
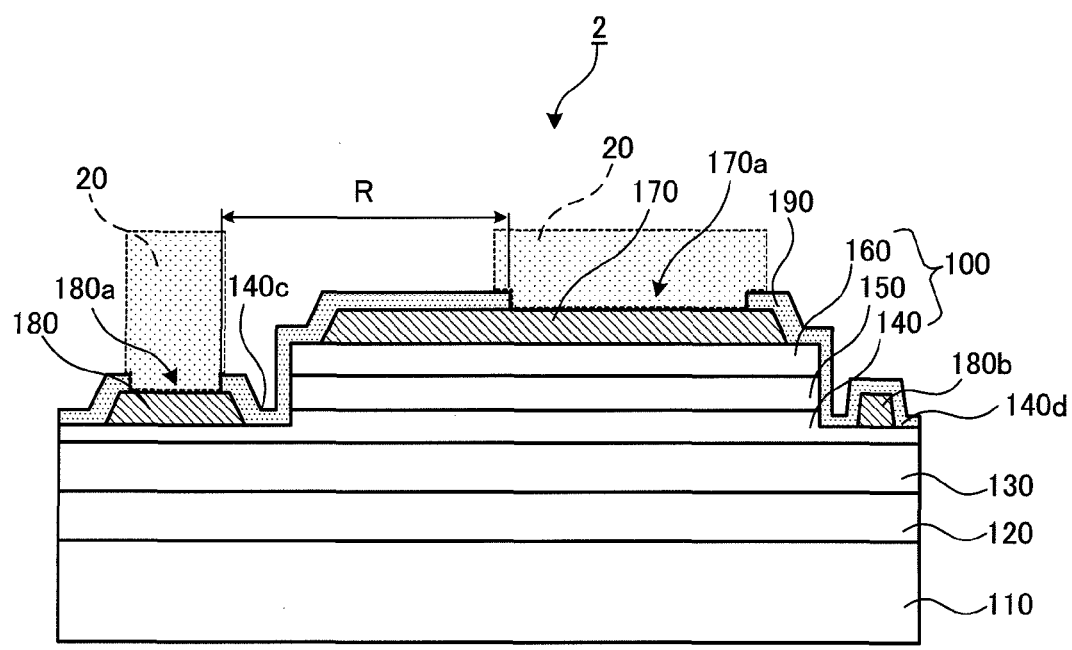
FIG. 6 is a diagram showing an example of a cross-sectional schematic view of a semiconductor light emitting element to which the second exemplary embodiment is applied.
Figure 7:
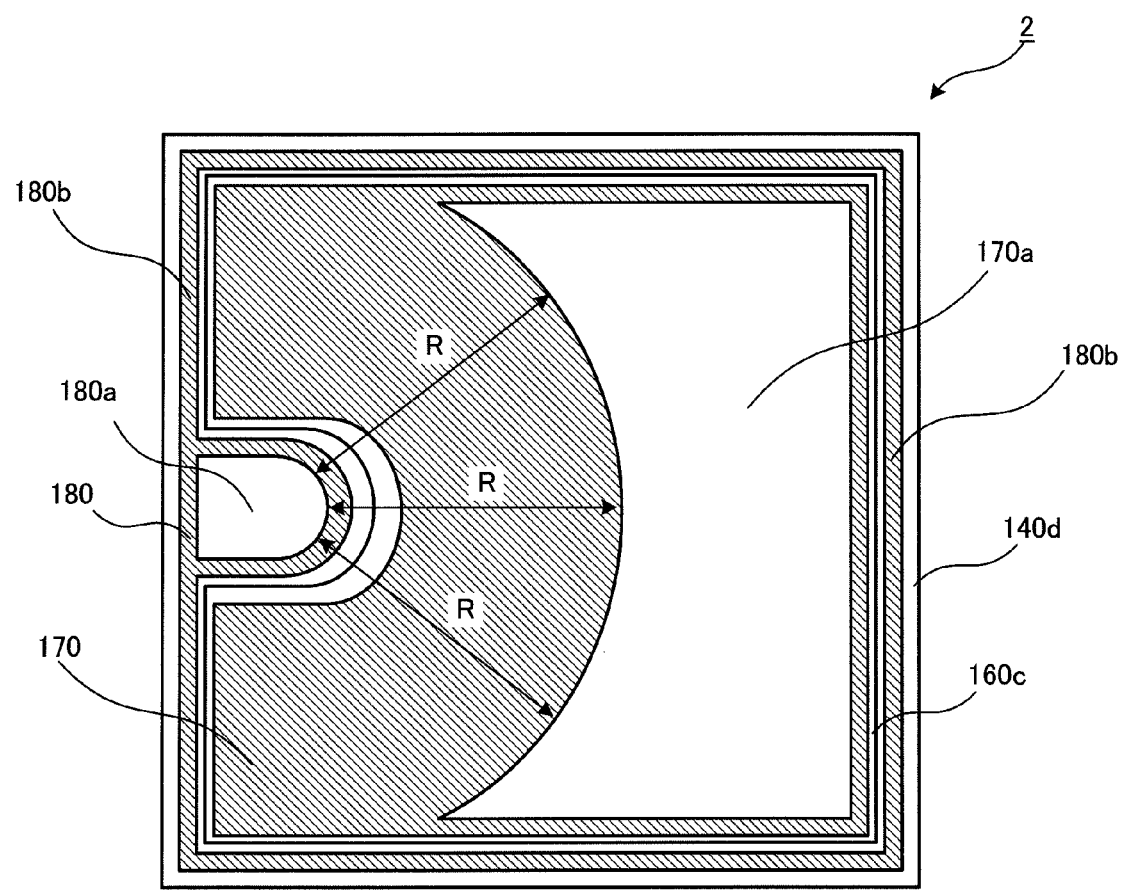
FIG. 7 is a diagram showing an example of a planar schematic view of the semiconductor light emitting element shown in FIG. 6.

FIG. 6 is a diagram showing an example of a cross-sectional schematic view of a semiconductor light emitting element 2 to which the second exemplary embodiment is applied. FIG. 7 is a diagram showing an example of a planar schematic view of the semiconductor light emitting element 2 shown in FIG. 6. The same reference numerals are used for the same configurations as the semiconductor light emitting element 1 shown in FIGS. 1 and 2, and description thereof is omitted.

As shown in FIG. 6, the semiconductor light emitting element 2 includes: the substrate 110; the intermediate layer 120 laminated on the substrate 110; the base layer 130; and the laminated semiconductor layer 100 (the n-type semiconductor layer 140, the light emitting layer 150 and the p-type semiconductor layer 160). Moreover, the semiconductor light emitting element 2 includes the first electrode 170 and the second electrode 180. Further, the first opening 170a is formed on the first electrode 170, and the second opening 180a is formed on the second electrode 180. The first opening 170a is formed to keep the constant distance R from an outer edge portion of the second opening 180a.

Additionally, in the semiconductor light emitting element 2, a branch portion 180b of the second electrode 180 is formed on a semiconductor layer exposure surface 140d of the n-type semiconductor layer 140, which has been exposed by cutting off the periphery of the laminated semiconductor layer 100 with a predetermined width in a planar view.

The protecting layer 190 covers: the first electrode 170; the second electrode 180 and the branch portion 180b; the p-type semiconductor layer 160, the light emitting layer 150 and a part (located on a light emitting layer 150 side compared to the semiconductor layer exposure surface 140c) of the n-type semiconductor layer 140; a whole area of the side-wall surfaces of the p-type semiconductor layer 160, the light emitting layer 150 and a part (located on a light emitting layer 150 side compared to the semiconductor layer exposure surface 140c) of the n-type semiconductor layer 140, included in the semiconductor light emitting element 2.

Next, as shown in FIG. 7, similarly to the semiconductor emitting element 1 shown in FIG. 2 described above, the first opening 170a for exposing the first electrode 170 and the second opening 180a for exposing the second electrode 180 are arranged so that an outer edge portion of the first opening 170a at a second opening 180a side and an outer edge portion of the second opening 180a at a first opening 170a side keep a constant distance R. In the exemplary embodiment, in a planar view, the first opening 170a at the second opening 180a side is formed into an arc so that the approximately constant distance R is kept from the outer edge portion of the second opening 180a, according to the shape of the second opening 180a at the first opening 170a side, which is formed into a semicircular shape. It should be noted that the protecting layer 190 covering the surfaces of the first electrode 170, the second electrode 180 and the branch portion 180b is omitted in FIG. 7, however, for an explanatory convenience sake, outlines of the openings 170a, 180a, the branch portion 180b and the like in a state of being covered with the protecting layer 190 are illustrated.

Furthermore, as shown in FIG. 7, in a planar view, in the semiconductor light emitting element 2, the second electrode 180 includes the branch portion 180b that is branched to surround the periphery of the first electrode 170 formed to cover approximately whole area of the top surface 160c of the p-type semiconductor layer 160, in other words, branched to get along the outer peripheral edge of the substrate 110.

As described above, by forming the branch portion 180b of the second electrode 180 to surround the periphery of the first electrode 170, deviations in current density and current distribution are reduced in the semiconductor emitting element 2 and an unevenness of light emission intensity does not occur.

Third Exemplary Embodiment

Figure 8:
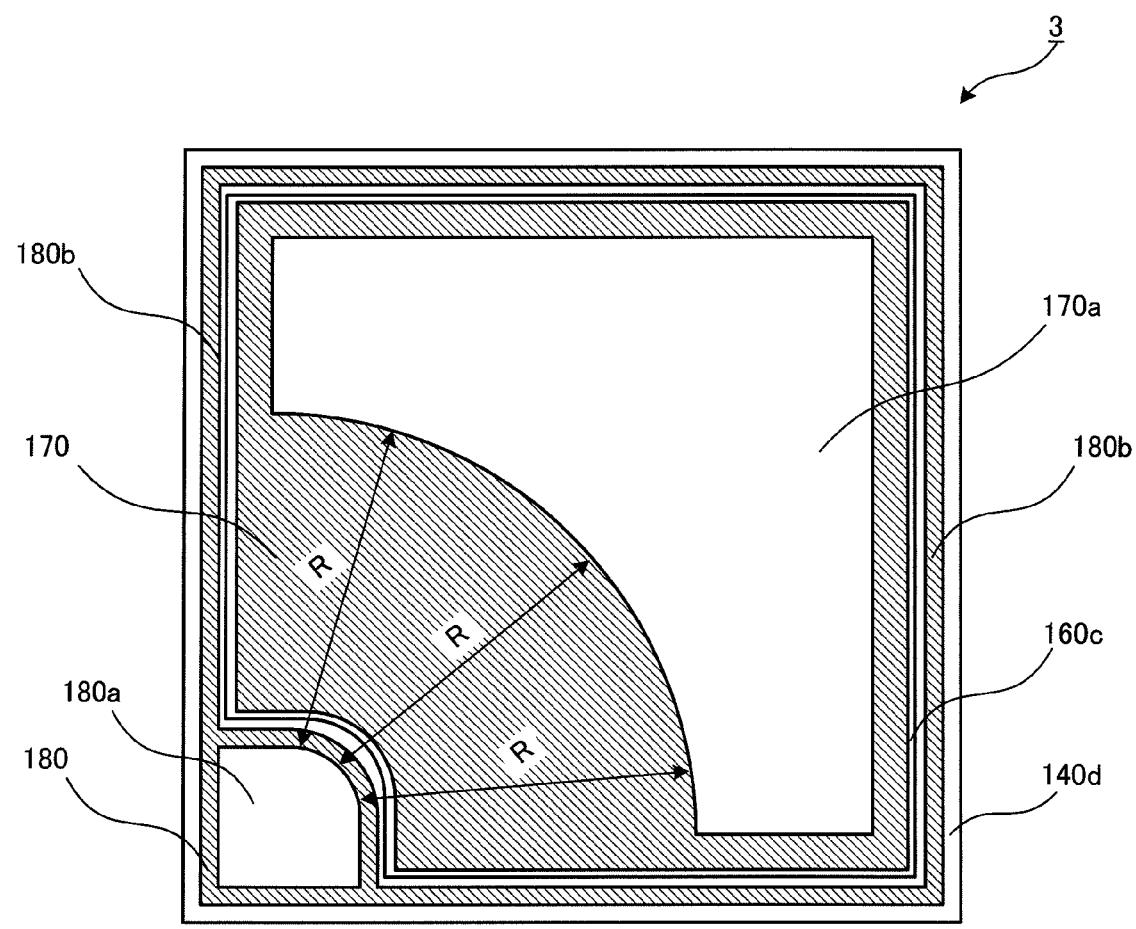
FIG. 8 is a diagram showing an example of a planar schematic view of a semiconductor light emitting element to which the third exemplary embodiment is applied.

FIG. 8 is a diagram showing an example of a planar schematic view of a semiconductor light emitting element 3 to which the third exemplary embodiment is applied. As shown in FIG. 8, in the semiconductor light emitting element 3, the second electrode 180 is arranged at a corner portion of a square (at the bottom-left corner in FIG. 8) in a planar view.

On the other hand, in a planar view, the first electrode 170 is formed to cover an approximately whole area of the top surface 160c of the p-type semiconductor layer 160 (refer to FIG. 1) except for the corner portion of the square (the bottom-left corner in FIG. 8), which has been removed by a method of etching or the like to form the second electrode 180 and the branch portion 180b branched from the second electrode 180. On a top surface of the first electrode 170, the first opening 170a which exposes the first electrode 170 and is used for electrical connection with the outside is formed. The first opening 170a exposes an approximately right-half and upper-half portion of the first electrode 170 in FIG. 8. The first opening 170a has a planar shape in which a portion at the second electrode 180 side is cut off so as to be formed into an arc.

As described above, in the semiconductor light emitting element 3, by arranging the second electrode 180 at the corner portion of the square in a planar view, an area of the first opening 170a can be set to be large while an area of the first electrode 170 can be set to be large.

Further, similarly to the semiconductor light emitting element 2 shown in FIG. 7, in a planar view, the second electrode 180 includes the branch portion 180b that is branched to surround the periphery of the first electrode 170, in other words, branched to get along the outer peripheral edge of the substrate 110.

Fourth Exemplary Embodiment

Figure 9:
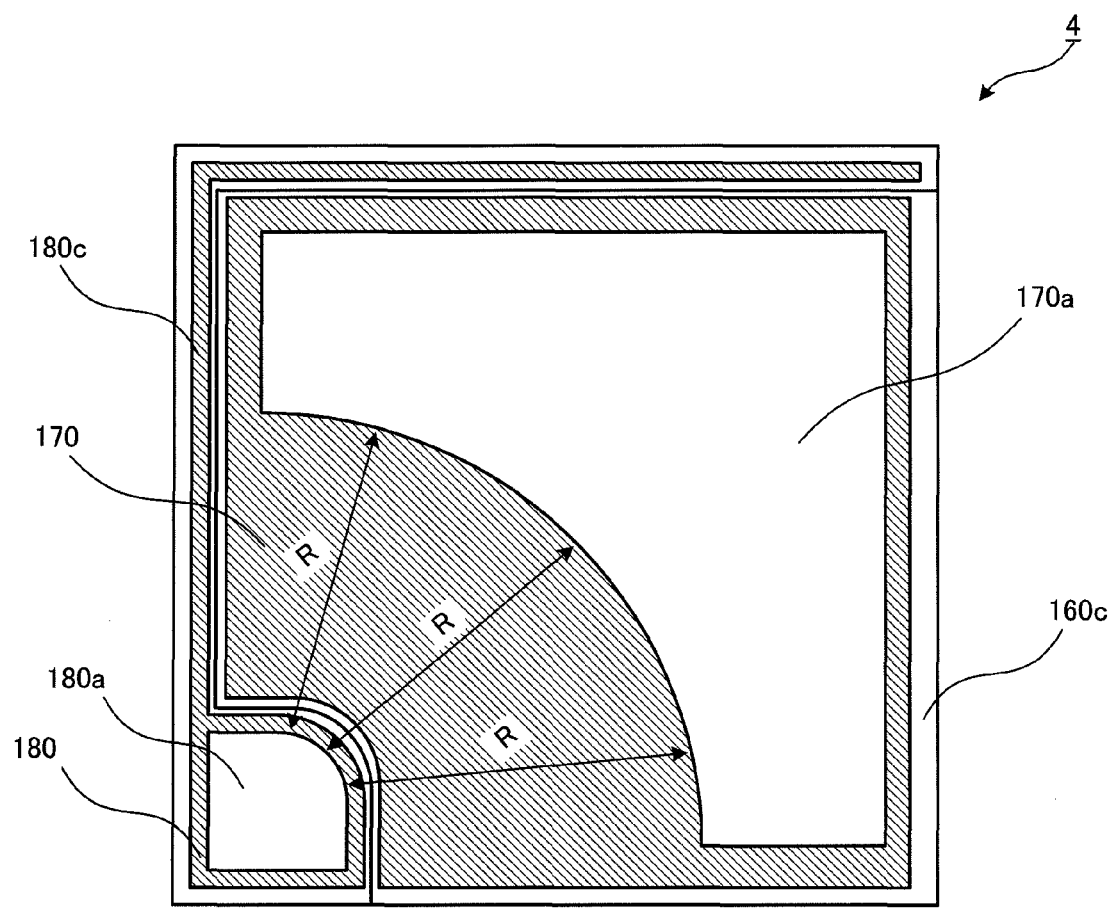
FIG. 9 is a diagram showing an example of a planar schematic view of a semiconductor light emitting element to which the fourth exemplary embodiment is applied.

FIG. 9 is a diagram showing an example of a planar schematic view of a semiconductor light emitting element 4 to which the fourth exemplary embodiment is applied. As shown in FIG. 9, similarly to the semiconductor light emitting element 3 shown in FIG. 8, in the semiconductor light emitting element 4, the second electrode 180 is arranged at a corner portion of a square (at the bottom-left corner in FIG. 9) in a planar view. Moreover, in a planar view, the first electrode 170 is formed to cover approximately whole area of the top surface 160c of the p-type semiconductor layer 160 (refer to FIG.

6), except for a portion which has been removed to form the second electrode 180 and a branch portion 180*c* branched from the second electrode 180. On the top surface of the first electrode 170, the first opening 170*a* exposing the first electrode 170 is formed. The first opening 170*a* exposes an approximately right-half and upper-half portions of the first electrode 170 in FIG. 9. The first opening 170*a* has a planar shape in which a portion at the second electrode 180 side is cut off so as to be formed into an arc.

Further, in a planar view, in the semiconductor light emitting element 4, the second electrode 180 includes the branch portion 180*c* that is branched to get along the periphery of two sides of the first electrode 170 having an approximately square shape. In other words, the branch portion 180*c* does not surround the outer peripheral edge of the first electrode 170, and has an approximately half length compared to that of the branch portion 180*b* branched from the second electrode 180 in the aforementioned light emitting element 3 (refer to FIG. 8).

Fifth Exemplary Embodiment

Figure 10:
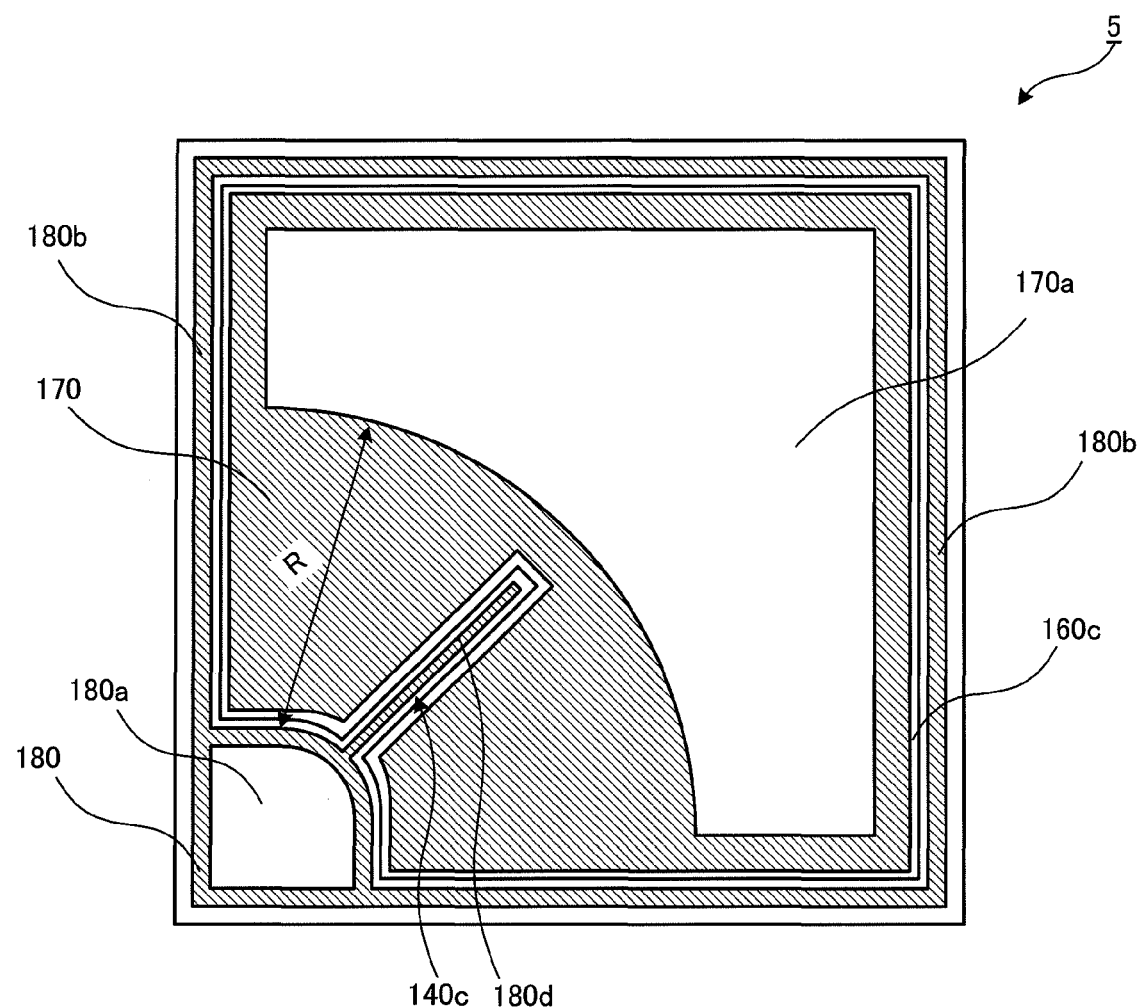
FIG. 10 is a diagram showing an example of a planar schematic view of a semiconductor light emitting element to which the fifth exemplary embodiment is applied.

FIG. 10 is a diagram showing an example of a planar schematic view of a semiconductor light emitting element 5 to which the fifth exemplary embodiment is applied. As shown in FIG. 10, similarly to the semiconductor light emitting element 3 shown in FIG. 8, in the semiconductor light emitting element 5, the second electrode 180 is arranged at a corner portion of a square in a planar view, and the second electrode 180 in a planar view includes the branch portion 180*b* that is branched to surround the periphery of the first electrode 170.

Further, the second electrode 180 includes a second branch portion 180*d* formed on a surface of the semiconductor layer exposure surface 140*c* that is exposed by cutting off a part of the laminated semiconductor layer 100 in a diagonal direction of the square-shaped substrate 110 in a planar view.

Moreover, in a planar view, the first electrode 170 is formed to cover approximately whole area of the top surface 160*c* of the p-type semiconductor layer 160 (refer to FIG. 6), except for a portion removed to form the second electrode 180, and the branch portion 180*b* and the second branch portion 180*d* of the second electrode 180. On the top surface of the first electrode 170, the first opening 170*a* exposing the first electrode 170 is formed. The first opening 170*a* exposes an approximately right-half and upper-half portions of the first electrode 170 in FIG. 10. The first opening 170*a* has a planar shape in which a portion on the second electrode 180 side is cut off so as to form an arc.

Sixth Exemplary Embodiment

Figure 11:
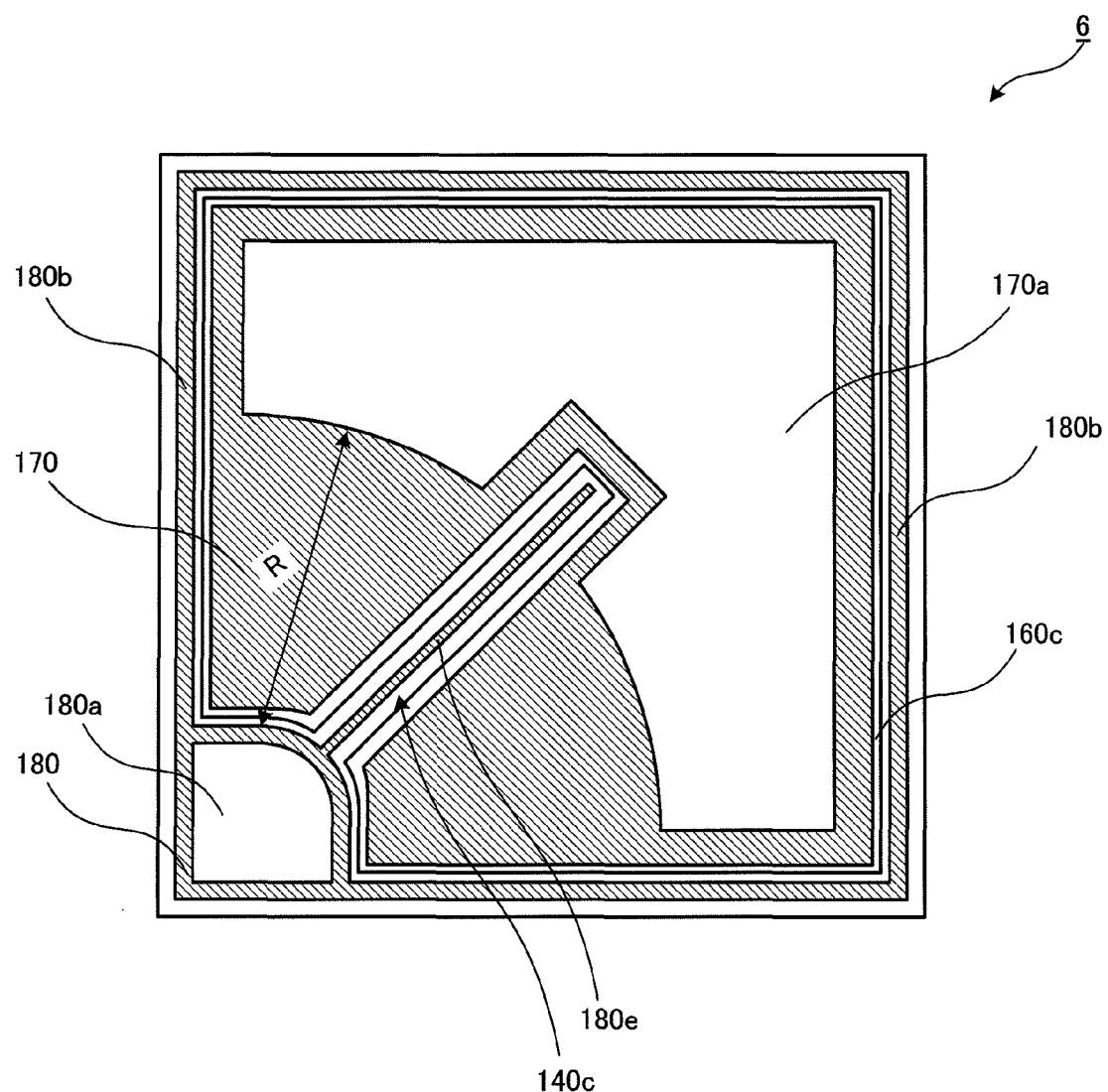
FIG. 11 is a diagram showing an example of a planar schematic view of a semiconductor light emitting element to which the sixth exemplary embodiment is applied.

FIG. 11 is a diagram showing an example of a planar schematic view of a semiconductor light emitting element 6 to which the sixth exemplary embodiment is applied. As shown in FIG. 11, similarly to the semiconductor light emitting element 5 shown in FIG. 10, in the semiconductor light emitting element 6, the second electrode 180 is arranged at a corner portion of a square in a planar view, and the second electrode 180 in a planar view includes the branch portion 180*b* that is branched to surround the periphery of the first electrode 170. The second electrode 180 includes a second branch portion 180*e* formed on a surface of the semiconductor layer exposure surface 140*c* that is exposed by cutting off a part of the laminated semiconductor layer 100 in a diagonal direction of the square-shaped substrate 110 in a planar view.

Further, as shown in FIG. 11, the second branch portion 180*e* is formed by cutting off a part of the laminated semiconductor layer 100 longer in the diagonal direction, compared to the semiconductor light emitting element 5 shown in FIG. 10. Because of this, the first opening 170*a* of the first electrode 170 includes a portion formed to be a rectangular shape so that a leading end of the second branch portion 180*e* digs into a part of an arc portion at the second electrode 180 side.

<Method for Using the Semiconductor Light Emitting Element 1>

Next, a method for using the semiconductor light emitting element 1 shown in FIG. 1 is explained.

Figure 13:
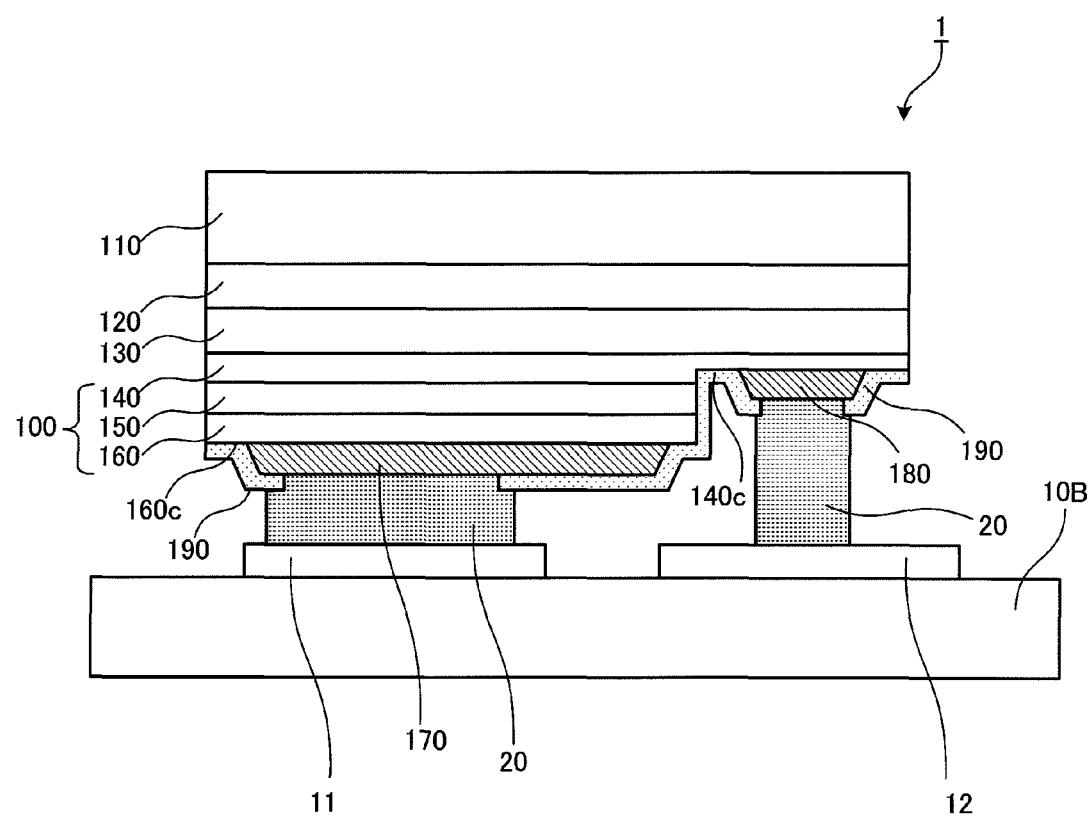
FIG. 13 is a diagram showing an example of a cross-sectional schematic view of a semiconductor light emitting device to which the exemplary embodiment is applied.

FIG. 13 is a diagram showing an example of a configuration of a light emitting device in which the semiconductor light emitting element 1 shown in FIG. 1 is mounted on a wiring board 10B.

A positive electrode 11 and a negative electrode 12 are formed on one surface of the wiring board 10B.

In a state that the semiconductor light emitting element 1 shown in FIG. 1 is vertically reversed with respect to the wiring board 10B as an example of a circuit board, the first electrode 170 (specifically, the first bonding layer 173) and the second electrode 180 (specifically, the second bonding layer 182) are electrically connected to and mechanically fixed to the positive electrode 11 and the negative electrode 12 using a bump (solder) 20, respectively. Such a method of connecting the semiconductor light emitting element 1 to the wiring board 10B is generally referred to as flip-chip connection. In the flip-chip connection, seen from the wiring board 10B, the substrate 110 of the semiconductor light emitting element 1 is placed farther than the light emitting layer 150.

Next, a light emitting operation of the light emitting device shown in FIG. 13 is explained. It should be noted that FIG. 4 is referred to regarding the first electrode 170.

When a current travelling from the positive electrode 11 to the negative electrode 12 is flowed through the semiconductor light emitting element 1 via the positive electrode 11 and the negative electrode 12 of the wiring board 10B, in the semiconductor light emitting element 1, a current from the first electrode 170 to the second electrode 180 via the p-type semiconductor layer 160, the light emitting layer 150 and the n-type semiconductor layer 140 is flowed, and thereby the light emitting layer 150 emits a blue light in four directions. At this time, in the first electrode 170, a current is flowed via the first bonding layer 173, the metal reflecting layer 172 and the first conductive layer 171 (refer to FIG. 4), and a current in a uniform state is supplied on a surface of the top surface 160*c* in the p-type semiconductor layer 160.

Of the light emitted from the light emitting layer 150, light travelling toward the substrate 110 is transmitted through the n-type semiconductor layer 140, the base layer 130, the intermediate layer 120 and the substrate 110, and outputted to the outside of the semiconductor light emitting element 1.

Of the light emitted from the light emitting layer 150, light travelling toward the first electrode 170 reaches the metal reflecting layer 172 via the p-type semiconductor layer 160 and the first conductive layer 171, and is reflected by the metal reflecting layer 172. The light reflected by the metal reflecting layer 172 is transmitted through the first conductive layer 171, the p-type semiconductor layer 160, the light emitting layer 150, the n-type semiconductor layer 140, the base layer 130, the intermediate layer 120 and the substrate 110, and outputted to the outside of the semiconductor light emitting element 1.

On the other hand, of the light emitted from the light emitting layer 150, light travelling in a lateral direction reaches the protecting layer 190 via the light emitting layer 150, for example, and is reflected by the protecting layer 190. The light reflected by the protecting layer 190 proceeds the inside of the semiconductor light emitting element 1, and directly outputted to the outside of the semiconductor light emitting element 1 or outputted thereto after being reflected by the metal reflecting layer 172, the protecting layer 190 or the like.

Here, a part of the light directly travelling from the light emitting layer 150 to the substrate 110, a part of the light travelling from the light emitting layer 150 to the substrate 110 via the metal reflecting layer 172 and a part of the light travelling from the light emitting layer 150 to the substrate 110 via the protecting layer 190 are reflected at, for example, a border between the substrate 110 and the outside, and return to the inside of the semiconductor light emitting element 1. The light that has returned to the inside of the semiconductor light emitting element 1 as described above is reflected by the metal reflecting layer 172 provided in the first electrode 170, the second conductive layer 181 provided in the second electrode 180 and the protecting layer 190, and then travels toward the substrate 110 side again. In the exemplary embodiment, light extraction efficiency from the semiconductor light emitting element 1 is improved by providing the metal reflecting layer 172 and the protecting layer 190 in the semiconductor light emitting element 1 and reflecting the light emitted from the light emitting layer 150 toward a side opposite to the substrate 110 by the metal reflecting layer 172 and the protecting layer 190.

EXAMPLES

Hereinafter, the present invention will be further described in detail on the basis of examples. However, the present invention is not limited to the examples as long as the gist thereof is not deviated.

<Measurement of Temperature at Connecting Portion (Junction Temperature)>

A junction temperature of a semiconductor light emitting element is evaluated by following method. The semiconductor light emitting element is mounted on a submount. Current of 1 µA is supplied to the semiconductor light emitting element through electrodes on the submount. A forward voltage (Vf; unit V) at 1 µA is measured. An environmental temperature is also measured at the same time. Then, an environmental temperature is varied. Vf (1 µA) monotonically reduces according to a rise of the environmental temperature. By plotting this relationship, a relation regarding changes of the environment temperature and Vf (1 µA) is obtained. Typical value of supplied current in general use of the semiconductor light emitting element is more than several mA or higher. Current of 1 µA is extremely small enough to prevent heating up the semiconductor light emitting element due to the current supply. The junction temperature measured at current of 1 µA is almost the same as the environment temperature. By measuring Vf (1 µA), the junction temperature can be estimated referring to the plotted relationship.

As for a junction temperature measurement at the aimed current, Vf (1 µA) current is measured at first before supplying the aimed current. Then, the aimed current is supplied. After waiting for a certain time sufficient to saturate the junction temperature, the aimed current is returned down to 1 µA, then immediately Vf (1 µA) is measured again. A change amount of rise of the temperature caused by supplying the aimed current is obtained from a change amount of Vf (1 µA) before and after the aimed current supply. The junction temperature is obtained by adding the environmental temperature to this.

Examples 1 to 9, Comparative Example 1

Six semiconductor light emitting elements explained in the first exemplary embodiment (refer to FIG. 2) to the sixth exemplary embodiment (refer to FIG. 11) described above were respectively mounted on a submount substrate (a circuit board) made of aluminum nitride (AlN).

Figure 12A:
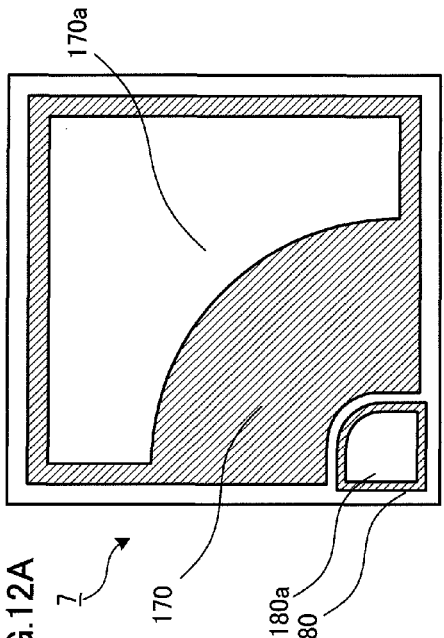
FIGS. 12A to 12C are diagrams showing examples of planar schematic views of semiconductor light emitting elements to which the seventh to ninth exemplary embodiments are applied.
Figure 12B:
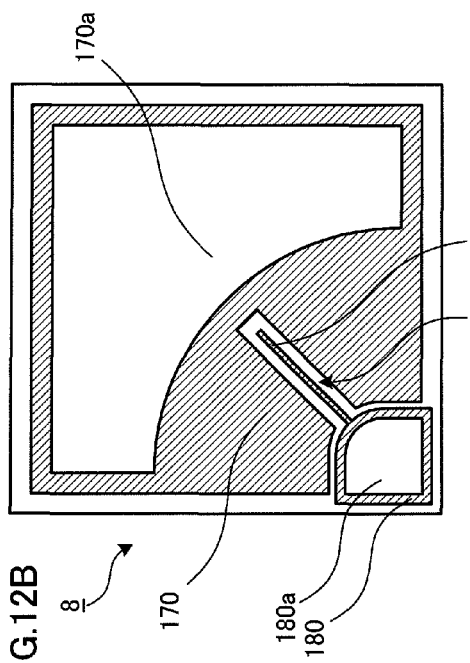
Figure 12C:
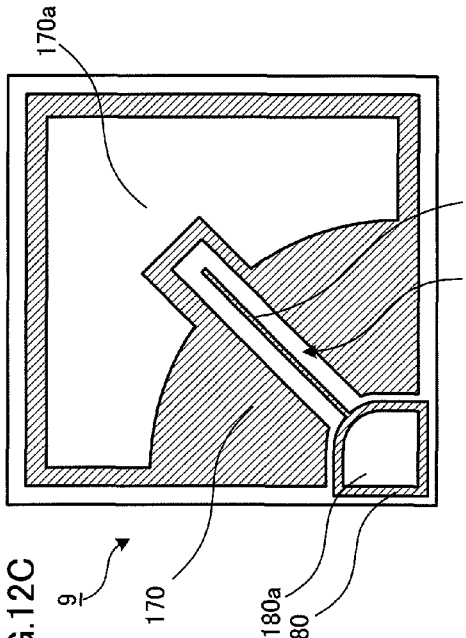

Further, as shown in FIGS. 12A to 12C, three semiconductor light emitting elements explained in the third exemplary embodiment (refer to FIG. 8), the fifth exemplary embodiment (refer to FIG. 10) and the sixth exemplary embodiment (refer to FIG. 11) with a configuration not including a branch portion of the second electrode were formed. These are referred to as a seventh exemplary embodiment (refer to FIG. 12A), an eighth exemplary embodiment (refer to FIG. 12B) and a ninth exemplary embodiment (refer to FIG. 12C), respectively. These three semiconductor light emitting elements were, similarly, mounted on a submount substrate made of aluminum nitride (AlN). It should be noted that the same reference numerals are used for the same configuration as the first exemplary embodiment (refer to FIG. 2) in the three semiconductor light emitting elements shown in FIGS. 12A to 12C.

Figure 12D:
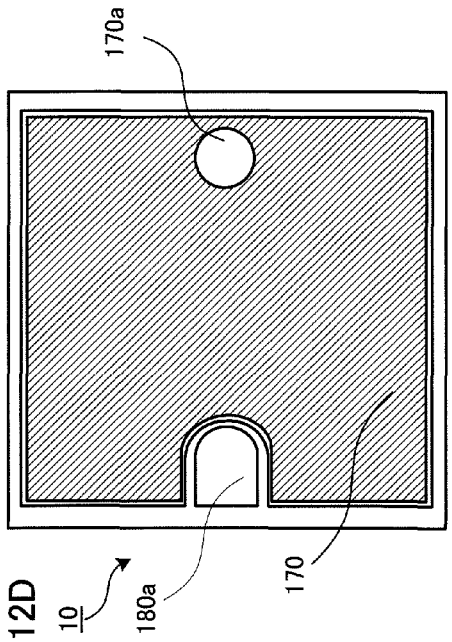
FIG. 12D is a diagram showing a comparative example.

Next, regarding these nine semiconductor light emitting elements, a forward voltage (Vf; unit V) and a light emitting amount (Po; unit mW) at each of three current values shown in Table 1 (20 mA, 80 mA, 150 mA) were measured, and a junction temperature (unit; ° C.) at 100 mA current in each condition was measured. For comparison, as shown in FIG. 12D, the same measurement was performed for an object in which a conventional semiconductor light emitting element was mounted on a submount substrate made of aluminum nitride (AlN). The results are shown in Table 1.

TABLE 1

|  |  | Exemplary embodiment | Branch portion of second electrode | Number of figure | Vf: Forward voltage (V) | | | Po: Light emitting amount (mW) | | | Junction temparature |
| --- | --- | --- | --- | --- | --- | --- | --- | --- | --- | --- | --- |
|  |  |  |  |  | 20 mA | 80 mA | 150 mA | 20 mA | 80 mA | 150 mA | (° C.) 100 mA |
| Example | 1 | First | Not provided | FIG. 2 | 2.95 | 3.25 | 3.58 | 23.40 | 74.2 | 120 | 96 |
|  | 2 | Second | Provided | FIG. 7 | 2.92 | 3.10 | 3.51 | 20.10 | 64.1 | 115 | 89 |
|  | 3 | Third | Provided | FIG. 8 | 2.92 | 3.11 | 3.52 | 20.12 | 64.2 | 115 | 89 |
|  | 4 | Fourth | Provided | FIG. 9 | 2.93 | 3.17 | 3.50 | 21.83 | 66.4 | 118 | 90 |
|  | 5 | Fifth | Provided | FIG. 10 | 2.92 | 3.13 | 3.54 | 19.50 | 62.1 | 111 | 91 |
|  | 6 | Sixth | Provided | FIG. 11 | 2.92 | 3.14 | 3.53 | 19.48 | 61.1 | 110 | 91 |
|  | 7 | Seventh | Not provided | FIG. 12A | 2.96 | 3.27 | 3.55 | 23.30 | 73.9 | 122 | 95 |
|  | 8 | Eighth | Not provided | FIG. 12B | 2.94 | 3.21 | 3.52 | 22.80 | 70.1 | 119 | 92 |
|  | 9 | Ninth | Not provided | FIG. 12C | 2.92 | 3.15 | 3.50 | 22.20 | 67.9 | 118 | 90 |

TABLE 1-continued

| Exemplary embodiment | Branch portion of second electrode | Number of figure | Vf: Forward voltage (V) | | | Po: Light emitting amount (mW) | | | Junction temparature (° C.) 100 mA |
|---|---|---|---|---|---|---|---|---|---|
| | | | 20 mA | 80 mA | 150 mA | 20 mA | 80 mA | 150 mA | |
| Comparative example | — | — | FIG. 12D | 2.96 | 3.27 | 3.63 | 23.30 | 73.9 | 120 | 105 |

From the results shown in Table 1, it is understood that the temperature at the connecting portion (junction temperature) is low in the nine semiconductor light emitting elements (the first exemplary embodiment to the ninth exemplary embodiment), compared to the conventional semiconductor light emitting element (comparative example) (examples 1 to 9/comparative example (105° C.). It is considered that this is because the heat release effect is improved due to the large size of the first opening 170a exposing the first electrode 170, compared to the conventional semiconductor light emitting element (comparative example).

Moreover, there is a tendency among the nine semiconductor light emitting elements (the first exemplary embodiment to the ninth exemplary embodiment) to decrease Vf (the forward voltage) and the junction temperature and obtain favorable power efficiency, due to the configuration including the branch portion of the second electrode.

For example, the comparison between the first exemplary embodiment in which the branch portion of the second electrode is not provided (refer to FIG. 2; junction temperature is 96° C. (the example 1)) and the second exemplary embodiment in which the branch portion of the second electrode is provided (refer to FIG. 7; junction temperature is 89° C. (the example 2)), the comparison between the seventh exemplary embodiment in which the branch portion of the second electrode is not provided (refer to FIG. 12A; junction temperature is 95° C. (the example 7)) and the third exemplary embodiment in which the branch portion of the second electrode is provided (refer to FIG. 8; junction temperature is 89° C. (the example 3)), the comparison between the eighth exemplary embodiment in which the branch portion of the second electrode is not provided (refer to FIG. 12B; junction temperature is 92° C. (the example 8)) and the fifth exemplary embodiment in which the branch portion of the second electrode is provided (refer to FIG. 10; junction temperature is 91° C. (the example 5)), and the like show such a tendency.

| Reference Signs List | |
|---|---|
| 1, 2, 3, 4, 5, 6, 7, 8, 9, 10 | semiconductor light emitting element |
| 10B | wiring board |
| 20 | bump (solder) |
| 100 | laminated semiconductor layer |
| 110 | substrate |
| 120 | intermediate layer |
| 130 | base layer |
| 140 | n-type semiconductor layer |
| 140c | semiconductor layer exposure surface |
| 150 | light emitting layer |
| 160 | p-type semiconductor layer |
| 160c | top surface |
| 170 | first electrode |
| 170a | first opening |
| 171 | first conductive layer |
| 172 | metal reflecting layer |
| 173 | first bonding layer |
| 174 | first adhesive layer |
| 180 | second electrode |

-continued

| Reference Signs List | |
|---|---|
| 180a | second opening |
| 180b | branch portion |
| 180c | second branch portion |
| 181 | second conductive layer |
| 182 | second bonding layer |
| 183 | second adhesive layer |
| 190 | protecting layer |

The invention claimed is:

1. A semiconductor light emitting element comprising:
a laminated semiconductor layer that is formed on a substrate and in which a first semiconductor layer having a first conductivity type, a light emitting layer, and a second semiconductor layer having a second conductivity type different from the first conductivity type are laminated;
a first electrode that is formed on a surface of the first semiconductor layer in the laminated semiconductor layer, and that has a first opening used for electrical connection with an outside;
a second electrode that is formed on a surface of the second semiconductor layer, and that has a second opening used for electrical connection with the outside, the surface of the second semiconductor layer being exposed by cutting off a part of the laminated semiconductor layer; and
a protecting layer disposed on the laminated semiconductor layer, wherein,
the first and second openings are formed in the protecting layer to expose the first and second electrodes, respectively,
the first opening has a concave arc portion opposite a convex arc portion of the second opening, the arc portion of the first opening is formed to keep an approximately equal distance from an outer edge portion of the second opening in a planar view, and
an area of the first opening is at least 30% of a surface area of the first electrode.

2. The semiconductor light emitting element according to claim 1, wherein
a planar shape of the substrate is a rectangle or a square; and
the arc portion of the first opening is formed to keep a distance having a length corresponding to at least 10% of a short side of the substrate, from the outer edge portion of the second opening.

3. The semiconductor light emitting element according to claim 1, wherein the second electrode has at least one branch portion branched to get along an outer peripheral edge of the substrate in a planer view.

4. The semiconductor light emitting element according to claim 1, wherein the second electrode has at least one branch portion formed on the surface of the second semiconductor layer, the surface of the second semiconductor layer being exposed by cutting off a part of the laminated semiconductor layer in a diagonal direction of the substrate in a planar view.

5. The semiconductor light emitting element according to claim 1, wherein the laminated semiconductor layer is composed of a group III nitride semiconductor.

6. The semiconductor light emitting element according to claim 1, further comprising:
   a first connector that is formed at the first opening of the first electrode, has a conductive property, and is used for electrical connection between the first electrode and the outside; and
   a second connector that is formed at the second opening of the second electrode, has a conductive property, and is used for electrical connection between the second electrode and the outside.

7. The semiconductor light emitting element according to claim 1, wherein the substrate has optical transparency.

8. The semiconductor light emitting element according to claim 1, wherein the substrate is composed of sapphire.

9. A semiconductor light emitting device comprising:
   a semiconductor light emitting element that comprises:
      a laminated semiconductor layer in which a first semiconductor layer having a first conductivity type, a light emitting layer, and a second semiconductor layer having a second conductivity type different from the first conductivity type are laminated in order;
      a first electrode that is formed on a surface of the first semiconductor layer in the laminated semiconductor layer, and that has a first opening used for electrical connection with an outside;
      a second electrode that is formed on a surface of the second semiconductor layer, and that has a second opening used for electrical connection with the outside, the surface of the second semiconductor layer being exposed by cutting off a part of the laminated semiconductor layer and;
   a protecting layer disposed on the laminated semiconductor layer, wherein
      the first and second openings are formed in the protecting layer to expose the first and second electrodes, respectively,
      the first opening has a concave arc portion opposite a convex arc portion of the second opening, the arc portion of the first opening is formed to keep an approximately equal distance from an outer edge portion of the second opening in a planar view, and
      an area of the first opening is at least 30% of a surface area of the first electrode; and
   a circuit board that is arranged so as to face a side where the first electrode and the second electrode of the semiconductor light emitting element are provided, and has a pair of wiring connected by a connector to each of the first electrode and the second electrode.

10. The semiconductor light emitting element according to claim 1, wherein the first semiconductor layer is a p-type layer and the second semiconductor is a n-type semiconductor layer.

11. The semiconductor light emitting element according to claim 9, wherein the first semiconductor layer is a p-type layer and the second semiconductor is a n-type semiconductor layer.

* * * * *